(12) United States Patent
Beyer et al.

(10) Patent No.: US 12,313,970 B2
(45) Date of Patent: May 27, 2025

(54) PHOTOPOLYMERIZABLE RELIEF PRECURSOR HAVING ADJUSTABLE SURFACE PROPERTIES

(71) Applicant: XSYS GERMANY GMBH, Willstatt (DE)

(72) Inventors: Matthias Beyer, Weinheim (DE); Armin Becker, Großniedesheim (DE); Torben Wendland, Renningen (DE); Isabel Schlegel, Rastatt (DE); Peter J Fronczkiewicz, Lake Wylie, SC (US); Anja Wundling, Rheinau (DE)

(73) Assignee: XSYS GERMANY GMBH, Willstatt (DE)

( * ) Notice: Subject to any disclaimer, the term of this patent is extended or adjusted under 35 U.S.C. 154(b) by 163 days.

(21) Appl. No.: 17/784,167

(22) PCT Filed: Dec. 14, 2020

(86) PCT No.: PCT/EP2020/086029
§ 371 (c)(1),
(2) Date: Jun. 10, 2022

(87) PCT Pub. No.: WO2021/116496
PCT Pub. Date: Jun. 17, 2021

(65) Prior Publication Data
US 2023/0031598 A1  Feb. 2, 2023

(30) Foreign Application Priority Data

Dec. 12, 2019 (EP) ................... 19215470

(51) Int. Cl.
*G03F 7/004* (2006.01)
*G03F 7/029* (2006.01)
*G03F 7/031* (2006.01)
*G03F 7/095* (2006.01)
*G03F 7/20* (2006.01)

(52) U.S. Cl.
CPC ............ *G03F 7/0048* (2013.01); *G03F 7/029* (2013.01); *G03F 7/031* (2013.01); *G03F 7/095* (2013.01); *G03F 7/2024* (2013.01)

(58) Field of Classification Search
None
See application file for complete search history.

(56) References Cited

U.S. PATENT DOCUMENTS 6,355,395 B1 * 3/2002 Zwez .................. G03F 7/0955
430/281.1
6,780,566 B2 * 8/2004 Hu .......................... G03F 7/033
522/95

(Continued)

FOREIGN PATENT DOCUMENTS

EP  1014194 A1  6/2000
EP  1710093 A1  10/2006
(Continued)

OTHER PUBLICATIONS

Translation of Anzai (Year: 2019).*
(Continued)

*Primary Examiner* — Sean M DeGuire
*Assistant Examiner* — Andrew Preston Traywick
(74) *Attorney, Agent, or Firm* — KDW Firm PLLC

(57) ABSTRACT

A photopolymerisable relief precursor includes a dimensionally stable carrier, and a photopolymerisable relief-forming layer at least containing a crosslinkable elastomeric binder, an ethylenically unsaturated monomer, a migration-capable, surface-active additive, a photoinitiator activatable with UVA light and a photoinitiator activatable with UVC light. A method for producing a relief structure.

25 Claims, 6 Drawing Sheets

(56) References Cited

U.S. PATENT DOCUMENTS

Figure 1:
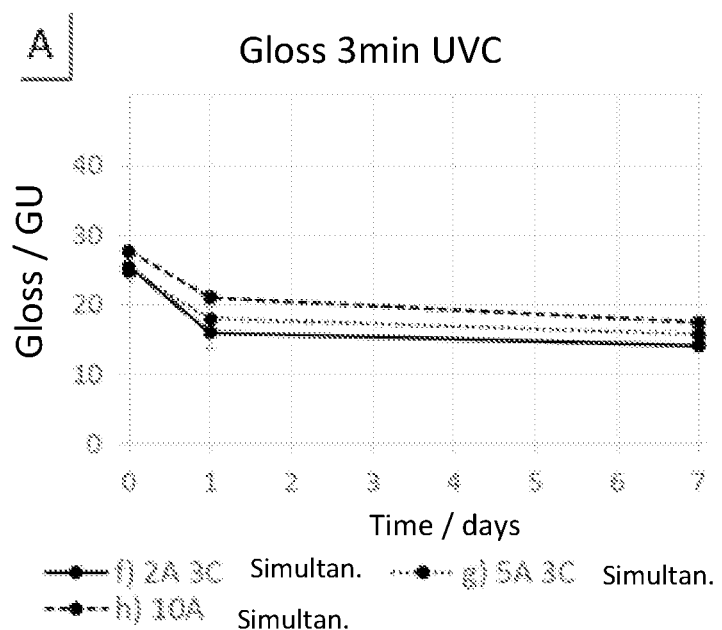

| | | | | |
|---|---|---|---|---|
| 7,901,863 B2 * | 3/2011 | Yamada | ................ | G03F 7/0752 |
| | | | | 430/286.1 |
| 8,114,566 B2 * | 2/2012 | Araki | .................... | G03F 7/0757 |
| | | | | 430/281.1 |
| 11,498,325 B2 * | 11/2022 | Telser | ................... | G03F 7/2022 |
| 2004/0259034 A1 * | 12/2004 | Schadebrodt | ............ | G03F 7/36 |
| | | | | 430/300 |
| 2010/0062375 A1 * | 3/2010 | Inno | ......................... | G03F 7/11 |
| | | | | 430/302 |

FOREIGN PATENT DOCUMENTS

| | | | | | |
|---|---|---|---|---|---|
| JP | | H055993 | A | | 1/1993 |
| JP | | 2004522194 | A | | 7/2004 |
| JP | | 2007147322 | A | * | 6/2007 |
| JP | | 2007148322 | A | | 6/2007 |
| JP | | 2019109436 | A | * | 7/2019 |
| WO | WO-2017068125 | A1 | * | 4/2017 | ............ B41C 1/003 |
| WO | | 2018177500 | A1 | | 10/2018 |
| WO | | 2019072701 | A1 | | 4/2019 |

OTHER PUBLICATIONS

Translated Claims of Anzai (Year: 2019).*
Translated Description of Anzai (Year: 2019).*
Translation of Yoshifumi (Year: 2007).*
International Search Report and Written Opinion for PCT/EP2020/086029, mailed Mar. 18, 2021 (eight (8) pages).
Arkon, "Hydrogenated Hydrocarbon Resins," Arakawa Brochure, Arcon Arakawa Chemical, 2019, 2 pages.

* cited by examiner

PHOTOPOLYMERIZABLE RELIEF PRECURSOR HAVING ADJUSTABLE SURFACE PROPERTIES

This application is a national stage filing under 35 U.S.C. 371 of pending International Application No. PCT/EP2020/086029, filed Dec. 14, 2020, which claims priority to European Patent Application No. 19215470.6, filed Dec. 12, 2019, the entirety of which applications are incorporated by reference herein.

The invention relates to a photopolymerisable relief precursor having surface properties which can be adjusted through the exposure conditions, a method for producing relief structures from the relief precursors, the relief structures themselves and their use.

Printing with solvent-based inks requires the printing plate to have an ink-repellent surface in order to prevent ink flowing into the interstitial spaces between screen dots. This is normally realised through the presence of a migration-capable, surface-active additive (MSA) in the relief layer which reduces the surface tension of the printing surface. However, the presence of this additive can be problematic when printing with UV-curing or water-based inks, as it results in poor ink transfer in the solid area, for instance. Different printing plates are therefore used for printing with solvent-based ink, UV-curing ink or water-based ink. An example of such a printing plate is indicated in EP1014194A1, but such a printing plate is only suitable for a particular type of solvent-based ink.

The object of the present invention is to provide a printing plate which is "switchable" in such a manner that its surface properties can be adjusted through exposure parameters so that the same printing plate can be used universally for different areas of application. The requirements on printing plates which print with solvent-based inks are different to those on printing plates which print with UV-curing or water-based inks.

The object is achieved with a photopolymerisable relief precursor comprising
 (A) a dimensionally stable carrier,
 (B) a photopolymerisable relief-forming layer at least containing a crosslinkable elastomeric binder, an ethylenically unsaturated monomer, a migration-capable, surface-active additive, a photoinitiator activatable with UVA light and a photoinitiator activatable with UVC light.

The relief precursors according to the invention make it possible to control the migration of the MSA to the surface through the choice of exposure parameters. It is assumed that the MSA aspires to diffuse onto the surface of the relief layer and thereby make this surface hydrophobic. Exposure to UVA light to a greater depth of penetration ensures greater crosslinking in the whole relief layer and stabilises the relief as a whole. Exposure to UVC light results in a lesser depth of penetration into the photoactive layer and ensures great re-crosslinking of the monomers and polymers still existing. The migration of the MSA to the surface of the relief is thereby reduced or prevented, which leads to a more hydrophilic surface. This in turn favours the wetting of the printing areas with a hydrophilic printing ink. The UVC exposure can also bring about the oxidation of formulation constituents, which leads to the formation of polar and hydrophilic groups.

Relief precursors according to the invention which are used as printing plates allow the following advantages to be realised, among others:

The surface properties can be adjusted in such a manner that the flowing of solvent-based ink into the interstitial spaces between the screen dots during printing is prevented or reduced. This in turn allows longer printing times before the plates have to be cleaned.

The surface tackiness and hence the tendency for dust and dirt to accumulate on the surface can be reduced by adjusting the surface properties.

The same printing plate can be used for printing with different types of printing ink in that the surface properties can be adjusted through the choice of re-exposure conditions in such a way that the printing plate is suitable for printing with solvent-based inks, aqueous inks or UV-curing inks.

Dimensionally stable carrier materials which can optionally exhibit further layers can be used as dimensionally stable carriers (A). Examples of suitable dimensionally stable carriers are plates, films and conical and cylindrical sleeves made of metals such as steel, aluminium, copper or nickel or made of plastics such as polyethylene terephthalate, polybutylene terephthalate, polyamide or polycarbonate or made of woven and nonwoven fabrics such as glass fibre wovens or composite materials made from glass fibres and plastics. Particularly suitable dimensionally stable carriers are dimensionally stable carrier films or metal sheets, examples being polyethylene films or polyester films, steel sheets or aluminium sheets.

These carrier films have a thickness of generally 50 to 1100 µm, preferably of 75 to 400 µm, for example approximately 250 µm. If a plastic film is used, its thickness is in the range of 100 to 200 µm, preferably 125 to 175 µm. If steel is used as a carrier material, steel sheets with a thickness of 0.05 to 0.3 mm are preferred. To protect against corrosion, preference is given to tin-plated steel sheets. These carrier films or carrier sheets can be coated with a thin, adhesion-promoting layer, for example a layer 0.05 to 5 µm thick, on the side of the carrier film facing the substrate layer. This adhesion layer may consist, for example, of a mixture of a polycarbonate, a phenoxy resin and a multifunctional isocyanate.

These carrier films or carrier sheets may already be furnished with a thin, adhesion-promoting layer (AH) or be provided with one. For the adhesion layers it is possible to use, for instance, polyurethane adhesion varnishes (e.g. in accordance with DE3045516) based on polyisocyanate-crosslinking polyether varnishes or polyester varnishes in layer thicknesses between 0.5 and 50 µm, in particular between 2 and 30 µm.

There may be additional adhesion-promoting intermediate layers (AH) on the side of the adhesion layer facing away from the carrier layer. These have layer thicknesses between 0.1 and 50, in particular between 1 and 10 µm, and may, for example, be obtained from a diluted aqueous-alcoholic solution of partially (up to 80 mole %, for example) hydrolysed polyvinyl ester, phenyl glyceryl ether monoacrylate and glyoxal, with drying and baking.

Adhesion-promoting layers or intermediate layers are intended to increase the adhesion between individual layers and stabilise the layer structure. This requires the selection of materials which can establish an interaction with both layers. Preferred examples of this are surfactants, amphipilic molecules having hydrophobic and hydrophilic areas and block copolymers, and oligomers which contain blocks which are compatible with both layers or the polymers in the layers. The adhesion between the dimensionally stable carrier (A) and the relief-forming layer (B) should be greater than 0.5 N/cm when measured in a peel test with a peel angle of 90° and a peeling rate of 30 mm/min.

The relief precursor comprises at least one photopolymerisable, relief-forming layer (B). The photopolymerisable, relief-forming layer can be applied directly on the carrier. However, there may also be other layers, such as adhesion layers or elastic or compressible underlayers, between the carrier and the relief-forming layer.

The relief-forming layer (B) may also consist of more than one layer, in which case it generally comprises 2 to 30 layers, preferably 2 to 5 layers, more preferably 2 to 3 layers and very preferably 2 layers. The layers may contain the same constituents or different constituents, and in the same or different proportions. Preferably these layers contain the same constituents. Preferably the relief-forming layers which are closest to the carrier layer are already fixed, crosslinked and/or reacted. Arranged on these fixed, crosslinked and/or reacted layers is a relief-forming layer which may also be fixed or crosslinked or may also react.

The skilled person is aware of elastomeric binders for the production of relief-forming layers of flexographic printing elements. Examples include styrene-diene block copolymers, natural rubber, polybutadiene, polyisoprene, styrolbutadiene rubber, nitrile-butadiene rubber, butyl rubber, styrene-isoprene rubber, styrene-butadiene-isoprene rubber, polynorbornene rubber or ethylene-propylene-diene rubber (EPDM). Preference is given to the use of hydrophobic binders. Such binders are soluble in organic solvents or mixtures thereof.

Preferably the elastomer is a thermoplastic elastomeric block copolymer of alkenyl aromatics and 1,3-dienes. The block copolymers can be both linear, branched or radial block copolymers. Commonly they are triblock copolymers of type A-B-A, but they may also be diblock polymers of type A-B or those with a plurality of alternating elastomeric and thermoplastic blocks, for example A-B-A-B-A. Mixtures of two or more different block copolymers may also be used. Commercial triblock copolymers frequently contain certain proportions of diblock copolymers. The diene units can be linked 1,2 or 1,4. Both block copolymers of styrene-butadiene or styrene-isoprene type and those of styrene-butadiene-isoprene type may be used. These are available commercially under the name Kraton©, for example. Thermoplastic elastomeric block copolymers with terminal blocks of styrene and a statistical styrene-butadiene middle block may also be used. The block copolymers may also be fully or partially hydrogenated, such as in SEBS rubbers. Preferred elastomeric binders are triblock copolymers of type A-B-A or radial block copolymers of type (AB)n, where A is styrene and B a diene, as well as statistical copolymers and random copolymers of styrene and a diene.

In a preferred embodiment of the invention, the thermoplastic elastomeric binders comprise at least one styrene-isoprene block copolymer, in particular styrene-isoprene-styrene block copolymer, whereby the polymers may also contain proportions of diblock styrene-isoprene copolymers. Preferred binders of the styrene-isoprene type generally contain 10 to 30% styrene by weight, preferably 12 to 28% by weight and more preferably 13 to 25% by weight. In a further embodiment, the binders are styrene-butadiene-styrene (SBS) block copolymers. Preferred SBS polymers generally contain 20 to 35% styrene by weight, preferably 22 to 33% by weight and more preferably 24 to 31% by weight. These block copolymers commonly have an average molecular weight MW (weight average) of 100,000 to 300,000 g/mol. Of course, mixtures of different styrene-isoprene block copolymers or styrene-butadiene block copolymers may also be used.

In a second embodiment of the invention, radial isoprene-styrene block copolymers may be used in preference. The isoprene and/or butadiene units in the polyisoprene blocks may be linked 1,4, meaning that the remaining double bond is arranged in the chain, or linked 3,4, meaning that the remaining double bond is arranged pendantly. Block copolymers which essentially have 1,4 linkages and binders which have certain proportions of 3,4 linkages may be used. The pendant vinyl group in binders with 3,4-linked units may preferably be able to react in the course of the crosslinking of the photopolymer is able layer and consequently produce a plate with high crosslinking. For example, block copolymers having a vinyl group content of 20 to 70% may be used.

In a preferred embodiment of the invention, a radial styrene-isoprene copolymer having a vinyl group content of less than 10% may be used. In a second preferred embodiment of the invention, a mixture of two different styrene-isoprene block copolymers is used. Preferably one of them has a vinyl group content of at least 20%, in particular 20 to 70%, and preferably 25 to 45%. The other may have a low vinyl group content, for example of less than 10%. Also preferably a mixture of two styrene-isoprene copolymers can be used, one of which having a high diblock fraction of more than 40% by weight and the second a lower diblock fraction of less than 30% by weight. In addition to the stated thermoplastic elastomeric block copolymers, in particular the styrene-isoprene block copolymers, the photopolymerisable layer may also comprise further elastomeric binders differing from the block copolymers. Such additional binders, also called secondary binders, enable the properties of the photopolymerisable layer to be modified. Vinyltoluene-alpha-methylstyrene copolymers are examples of secondary binders. In general the amount of such secondary binders should not exceed 25% by weight based on the total amount of all binders used. Preferably the amount of such secondary binders does not exceed 15% by weight, more preferably not 10% by weight. The overall amount of binders is commonly 30 to 90% by weight based on the sum of all constituents of the relief-forming layer, preferably 40 to 85% by weight and more preferably 60 to 85% by weight.

In the case of relief precursors which can be developed aqueously, water-soluble, swellable, dispersible or emulsifiable polymers are used. In addition to fully or partially hydrolysed polyvinyl acetates, polyvinyl alcohols, polyvinyl acetals, polystyrene sulphonates, polyurethanes, polyamides (such as those described in EP 0085472 or in DE 1522444) and any combinations thereof can be used. Examples of such polymers can be found in EP 0079514, EP 0224164 or EP 0059988. These polymers may be linear, branched, star-shaped or dendritic and exist as homopolymers, statistical copolymers, block copolymers or alternating copolymers. Very often the stated polymers are provided with functional groups which can either increase solubility and/or participate in crosslinking reactions. These groups include, for example, carboxyl, $SO_3$, OH, thiol, ethylenically unsaturated, (meth)acrylate and epoxide groups and any combinations thereof.

In the case of the relief-forming layer (B), the total amount of binders is commonly 30 to 90% by weight based on the sum of all constituents of the relief-forming layer, preferably 40 to 85% by weight and more preferably 45 to 85% by weight.

The relief-forming layer (B) may contain further constituents selected from the group consisting of plasticizers, solvents, other binders, colouring agents, stabilizers, regulators, UV absorbers, dispersing auxiliaries, crosslinkers, viscosity modifiers, surface-active substances and any combinations thereof. These additives, auxiliaries and adjuvants are contained in the radiosensitive mixture in an overall concentration in the range of 0.001 to 60% by weight based on the overall formulation, preferably in the range of 0.01 to 50% by weight, more preferably in the range of 0.1 to 50% by weight and very preferably in the range of 1 to 50% by weight. The individual additives are contained in concentrations from 0.001 to 40% by weight based on the overall formulation, preferably in the range of 0.01 to 40% by weight, more preferably in the range of 0.1 to 40% by weight and very preferably in the range of 0.1 to 35% by weight.

The photopolymerisable relief-forming layer (B) also comprises in the known manner at least one ethylenically unsaturated monomer which is compatible with the binder or binders. The ethylenically unsaturated monomer can also be mixtures of two or more different monomers. Suitable compounds have at least one olefinic double bond and are polymerisable. They are therefore referred to below as monomers. Monomers which have been found to be particularly advantageous are esters or amides of acrylic or methacrylic acid having monofunctional or polyfunctional alcohols, amines, amino alcohols or hydroxy ethers and esters, esters of fumaric or maleic acid, vinyl ether, vinyl ester and allyl compounds.

In general these monomers are not gaseous compounds at room temperature. Preferably the ethylenically unsaturated monomer contains at least 2 ethylenically unsaturated groups, more preferably 2 to 10 ethylenically unsaturated groups and very preferably 2 to 6 ethylenically unsaturated groups. Compounds with C—C triple bonds may also be used in the radiosensitive mixture. Preferably the ethylenically unsaturated group is at least an acrylate and/or a methacrylate group, but styrene derivatives, acrylamides, vinyl esters and vinyl ethers may also be used. The ethylenically unsaturated monomer has a molecular weight generally of less than 600 g/mol, preferably less than 450 g/mol, more preferably less than 400 g/mol, very preferably less than 350 g/mol and in particular less than 300 g/mol.

Possibilities include in particular derivatives of acrylic or methacrylic acid, such as their esters with univalent or multivalent alcohols, for example acrylic or methacrylic acid esters of alkanols having 1 to 20 carbon atoms, such as methyl methacrylate, ethyl acrylate, propyl (meth)acrylate, isopropyl (meth)acrylate, n-butyl (meth)acrylate, isobutyl (meth)acrylate, tert.-butyl (meth)acrylate, hexyl (meth)acrylate, cyclohexyl (meth)acrylate, 2-ethylhexyl (meth)acrylate, lauryl (meth)acrylate, (meth)acrylesters of multivalent alcohols having 2 to 20 carbon atoms, e.g. 2-hydroxyethyl (meth)acrylate, 2-hydroxypropyl (meth)acrylate, ethylene glycol di(meth)acrylate, polyethylene glyvol di(meth)acrylate, 1,4-butanediol di(meth)acrylate, neopentyl glycol di(meth)acrylate, 3-methyl pentanediol di(meth)acrylate, 1,1,1-trimethylolpropane tri(meth)acrylate, 1,4-butanediol diacrylate, 1,6-hexanediol diacrylate, 1,6-hexanediol dimethacrylate, 1,9-nonanediol diacrylate, di-, tri- and tetraethylene glycol di(meth)acrylate, tripropylene glycol di(meth)acrylate or pentaerythrittetra (meth)acrylate, also poly (ethylene oxide) di(meth)acrylate, m-methylpoly-(ethylene oxide)-yl-(meth)acrylate, N,N-diethylamino ethyl acrylate, a reaction product from 1-mole glycerine, 1-mole epichlorohydrin and 3-mole acrylic acid and glycidyl methacrylate and bisphenol A diglycidyl ether acrylate.

Also suitable are derivatives of acryl amide and methacrylic amide, such as ethers of their N-methylol derivatives with univalent and multivalent alcohols, e.g. ethylene glycol, glycerine, 1,1,1-trimethylol propane, oligomeric or polymeric ethylene oxide derivatives. These are particularly suitable if polyamides or polyvinyl alcohols are used as binders.

Also suitable are what are known as epoxy and urethane (meth)acrylates such as those which can be obtained through the reaction of bisphenol A diglycidyl ether with (meth) acrylic acid or the reaction of diisocynates with hydroxyalkyl (meth)acrylates or with polyesters or polyethers containing hydroxyl groups. Other olefinically unsaturated compounds which may be used include esters of acrylic or methacrylic acid, in particular those with a low vapour pressure and those which are modified by compatibilizers, e.g. with hydroxyl, amido, sulphonated ester or sulphonamide groups. Mixtures of the above copolymerisable ethylenically unsaturated organic compounds may also be used.

Preferred ethylenically unsaturated monomers are 1,4-butanediol di(meth)acrylate, neopentyl glycol di(meth)acrylate, 3-methyl pentanediol di(meth)acrylate, 1,1,1-trimethylolpropane tri(meth)acrylate, 1,4-butanediol diacrylate, 1,6-hexanediol diacrylate, 1,6-hexanediol dimethacrylate, 1,9-nonanediol diacrylate, di-, tri- and tetraethylene glycol di(meth)acrylate, tripropylene glycol di(meth)acrylate and pentaerythrittetra (meth)acrylate.

In one embodiment the ethylenically unsaturated monomer is contained in a concentration in the range of 0.5 to 60% by weight based on the overall formulation, preferably in the range of 1 to 50% by weight, more preferably in the range of 1 to 40% by weight and very preferably in the range of 2 to 40% by weight.

The photopolymerisable relief-forming layer also contains a migration-capable, surface-active additive.

Preferred migration-capable, surface-active additives are selected from the group consisting of ionic or non-ionic surfactants, long-chain hydrocarbons, waxes, in particular paraffin waxes, organosilicon compounds, in particular silicon oils, silanes and siloxanes, or mixtures thereof. Particularly suitable organosilicon compounds are polysiloxane (meth)acrylates, polysiloxanamines, vinyl-terminated polysilanes and polysiloxanes, polyether polysiloxanes and mixtures thereof. Examples of compounds from the above classes are available under the following trading names Polyvest ST-E 100, Silico Glide T-41, Silico Glide T-57, AFCONA-3700, Silicon F. 1000, Silicon F. 60000, Rad 2010, Rad 2200N, Rad2300, Rad 2500, Rad2700, Rad 2800, Miramer SIU 2400, X-22-2445, X-22-174BX, KBM-5103, X-22-161B, KF-8010, Silmer OH ACR C50, Silmer OH ACR Di-400, Silmer ACR Di-10, Silmer OH ACR D4, AFCONA-3835 and Sartomer CN9800.

In one preferred embodiment, the migration-capable, surface-active additive is a paraffin wax. Branched and/or unbranched paraffin waxes with a chain length of more than 15 C atoms are preferred, more preferably more than 20 C atoms and very preferably more than 30 C atoms. Chain lengths in the region of 20 to 40 C atoms are also preferred.

The photopolymerisable relief-forming layer also contains a photoinitiator activatable with UVA light and a photoinitiator activatable with UVC light.

Preferred photoinitiators activatable with UVA light are selected from the group consisting of benzil ketals, acylphosphine oxides, bisacylphosphine oxides, aminophenyl ketones, phenyloxime esters and mixtures thereof.

Preferred photoinitiators activatable with UVC light are selected from the group consisting of hydroxyphenyl ketones, benzoyl formates, benzophenones, arylalkyl ketones, arylbenzyl ketones and mixtures thereof.

In one particularly preferred embodiment, the photoinitiator activatable with UVA light is selected from the group consisting of diphenyl (2,4,6-trimethyl benzoyl)phosphine oxide, benzil dimethyl ketal and benzil diethyl ketal and the photoinitiator activatable with UVC light is selected from the group consisting of oxyphenyl acetic acid 2-[2-oxo-2-phenylacetoxy-ethoxylethylester, oxyphenyl acetic acid 2-[2-hydroxyethoxylethylester, methylbenzoyl formate, p-tolyl undecyl ketone, 1-hydroxycyclohexyl phenyl ketone and 2-hydroxy-2-methyl-1-phenyl propane-1-on and mixtures thereof.

The migration-capable, surface-active additive is generally contained in the photopolymerisable relief-forming layer in an amount of 0.1 to 10% by weight, preferably 0.2 to 5% by weight and more preferably 0.5 to 1.5% by weight based on the weight of the photopolymerisable relief-forming layer.

The photoinitiator activatable with UVA light is generally contained in the photopolymerisable relief-forming layer in an amount of 0.5 to 20% by weight, preferably 0.5 to 15% by weight, more preferably 0.5 to 10% by weight and very preferably 0.5 to 6% by weight based on the overall weight of the photopolymerisable relief-forming layer.

The photoinitiator activatable with UVC light is generally contained in the photopolymerisable relief-forming layer in a concentration of 0.1 to 20% by weight, preferably 0.1 to 10% by weight, more preferably 0.5 to 5% by weight and very preferably 0.25 to 3% by weight based on the overall weight of the photopolymerisable relief-forming layer.

In general, the mass ratio of photoinitiator activatable with UVA light to photoinitiator activatable with UVC light is 0.1 to 50, preferably 0.5 to 40, more preferably 0.5 to 30 and very preferably 0.5 to 15.

In general, the ratio of the amount of photoinitiator activatable with UVA light to migration-capable, surface-active additive is 0.01 to 10, preferably 0.1 to 5 and more preferably 0.1 to 3.

The photopolymerisable relief precursor according to the invention may exhibit one or a plurality of further layers selected from the group consisting of an adhesion layer and/or a compressible layer between the carrier layer and the relief-forming layer, a functional layer arranged above the relief-forming layer, for example a structure-giving layer, a barrier layer, a cover layer and a digitally reproducible mask layer and combinations of two or more of these layers.

For example, the photopolymerisable relief precursor may exhibit an intermediate layer, preferably an adhesion layer and/or a compressible layer, between the carrier layer and the photopolymerisable relief-forming layer.

The photopolymerisable relief precursor may exhibit on the side of the photopolymerisable relief-forming layer facing away from the carrier layer a further layer selected from the group consisting of a mask layer, a barrier layer, a cover layer and combinations of two or more of these layers.

In one preferred embodiment, the photopolymerisable relief precursor comprises
(A) a dimensionally stable carrier;
(AH) optionally an adhesion-promoting layer;
(B) a photopolymerisable relief-forming layer at least containing a crosslinkable elastomeric binder, an ethylenically unsaturated monomer, a migration-capable, surface-active additive, a photoinitiator activatable with UVA light and a photoinitiator activatable with UVC light;
(C) a laser-ablatable mask layer, at least contain a non-radically crosslinkable elastic polymer, a UVA light-absorbing material and an IR light-absorbing material; and optionally
(D) a cover layer which can be peeled off.

The relief precursor according to the invention preferably contains a laser-ablatable mask layer (C) which is arranged above the relief-forming layer (B) and can also be removed using solvents or by heating and adsorption/absorption. This layer is heated and volatilized by selective irradiation by means of high-energy electromagnetic radiation, so generating a mask with imagewise structuring which is utilised for transferring the structure to the relief precursor. To that end it must be impermeable in the UV range and must absorb radiation in the VIS-IR range, causing the layer to heat up and be ablated.

The optical density of the mask layer in the UV range of 330 to 420 nm is in the range of 1 to 5, more preferably in the range of 1.5 to 4 and very preferably in the range of 2 to 4. The optical density is determined by measurement with an X-rite 361TX densitometer in the "Density" setting with UV filter.

The layer thickness M of the laser-ablatable mask layer (C) is generally 0.1 µm to 5 µm. If layer thicknesses are below 0.1 µm, it is difficult to achieve a sufficient optical density. If layer thicknesses are more than 5 µm, the laser sensitivity of the element is too low, so that long laser times are required for imaging. The layer thickness is preferably 0.3 µm to 4 µm, particularly 1 µm to 3 µm. The laser sensitivity of the mask layer (measured as the energy that is required in order to ablate 1 $cm^2$ of the layer) ought to be between 0.1 and 10 $J/cm^2$, preferably between 0.3 and 5 $J/cm^2$ and more preferably between 0.5 and 5 $J/cm^2$.

The mask layer (C) comprises at least one non-radically crosslinkable elastic polymer which is able to distribute evenly the components that absorb the electromagnetic radiation and which is ablated as efficiently as possible when heated. The elastic polymer may be a linear, branched, star-shaped, comb-shaped or dendritic homopolymer or copolymer. Copolymers may be present as statistical and/or block copolymers. The elastic polymer may also be a mixture of different polymers which differ for example in structure, monomer composition, block length, molecular weights, functional groups, their number and/or distribution. Mixtures of polymers may also be used.

Examples of very suitable, non-radically crosslinkable elastic polymers for the mask layer (C) include ethylene vinyl acetates, flexibly elastic polyamides, flexibly elastic polyurethanes, nitrocellulose, polyvinyl acetals such as poly (vinylbutyral-vinyl alcohol) copolymers (or poly(vinylbutyral vinyl ethyral-vinyl alcohol) copolymers. Other flexibly elastic materials may of course also be used as binders, such as partially hydrolysed polyvinyl acetates, for example. A preferred binder for the mask layer (C) is a flexibly elastic polyamide, a polyvinyl alcohol, a partially hydrolysed polyvinyl acetate or a partially hydrolysed polyvinyl acetal.

This mask layer (C) may be permeable or impermeable to oxygen.

Generally the relief-forming layer (B) and the ablatable mask layer (C) are soluble in the commonplace, commercially available washout media which in general consist of solvent mixtures or aqueous solutions. These washout media consist of one or more nonpolar hydrocarbon solvents as the principal constituent, with a secondary constituent in the form of an alcohol of moderate polarity, such as benzyl alcohol, n-pentanol, cyclohexanol, ethylhexanol, or heptyl alcohols. Aqueous solutions customarily comprise surfactants and/or flocculating agents and in general have a pH>7. The relief-forming layer (C) can be processed in these washout media in customary times.

Furthermore, the relief-forming layer (B) and the ablatable mask layer (C) may also be thermally developed or removed (see, for example, EP 1 239 329 or EP 1 170 121). In this case, following image-wise exposure, the relief structures are heated to the softening or melting temperature. This renders the unexposed and noncrosslinked regions of the relief structure partially liquid and tacky, and they are then removed continuously by being suctioned up (absorption) with a nonwoven or a woven fabric.

In a further embodiment, between layers (B) and (C) in the relief precursor according to the invention there is a further layer (E) which is impermeable to oxygen. If an oxygen-impermeable layer (E) is present, then the layers (B) and/or (C) are preferably permeable to oxygen. The layer thickness of the layer (E) here is in the range from 3 to 5 µm. Besides adjuvants, the layer primarily comprises one or more elastic polymers which have a low oxygen permeability, their oxygen permeability being at a value of less than or equal to $1.5*10^5$ cm$^3$*µm/(m$^2$*d*bar). The polymers in the layer (E) preferably are likewise non-radically crosslinkable.

Examples of suitable elastic polymers which can be developed thermally and/or are soluble in organic solvents and which possess a sufficient barrier effect toward oxygen are partially hydrolysed polyvinyl acetates having a degree of hydrolysis of 30 up to a maximum of 80 mol %, ethylene-vinyl acetate copolymers and ethylene-vinyl alcohol copolymers, and ethylene-vinyl acetate-vinyl alcohol copolymers. Also highly suitable are cyclic acetals of polyvinyl alcohol such as polyvinyl butyral, polyvinyl ethyral, polyvinyl formal, polyvinyl propyral, and also copolymers containing two or more different vinyl acetal units selected from vinyl formal, vinyl ethyral, vinyl propyral, and vinyl butyral units. The polyvinyl acetals are always copolymers with vinyl alcohol units, since the reaction of polyvinyl alcohol to the full acetal is incomplete for statistical and steric reasons. To be exact, therefore, poly(vinylbutyral) is a poly(vinylbutyral-vinyl alcohol). The residual OH content of the stated polyvinyl acetals is customarily between 10 and 30% by weight. Vinyl ethyral-vinyl butyral-vinyl alcohol copolymers (poly(vinyl ethyral-vinyl butyral)), for example, are very suitable.

The object of the invention is also a method for the production of a relief structure, having the following steps:
(i) provision of a photopolymerisable relief precursor containing at least one migration-capable, surface-active additive,
(ii) application of a mask or generation of a structured mask layer above the photopolymerisable relief-forming layer,
(iii) optionally exposure of the back side to electromagnetic radiation through the carrier layer,
(iv-a) exposure of the photopolymerisable relief-forming layer to electromagnetic radiation, preferably in the wavelength range from 315 to 380 nm, through the mask or mask layer,
(v) removal of the mask or mask layer, any further layers that may be present and the non-photopolymerised regions of the relief-forming layer not exposed in step (iv), thereby generating a relief,
(vi) optional drying of the relief,
(vii) re-exposure of the relief from the side facing away from the carrier layer to UVA light in the wavelength range from 315 to 380 nm and/or to UVC light in the wavelength range from 200 to 280 nm, whereby the relief is re-crosslinked and its permeability for the migration-capable surface-active additive is adjusted, for adjustment of the surface properties of the relief, preferably for the use of specific printing inks,
(viii) optionally further processing steps.

The object of the invention is further a method for the production of a relief structure, having the following steps:
(i) provision of a photopolymer is able relief precursor containing at least one migration-capable, surface-active additive,
(iii) optionally exposure of the back side to electromagnetic radiation through the carrier layer,
(iv-b) imaging exposure of the photopolymerisable relief-forming layer to electromagnetic radiation, preferably in a wavelength range from 315 to 380 nm,
(v) removal of any further layers that may be present and the non-photopolymerised regions of the relief-forming layer not exposed in step (iv), thus generating a relief,
(vi) optional drying of the relief,
(vii) re-exposure of the relief from the side facing away from the carrier layer to UVA light in the wavelength range from 315 to 380 nm and/or to UVC light in the wavelength range from 200 to 280 nm, whereby the relief is re-crosslinked and its permeability for the migration-capable surface-active additive is adjusted, for adjustment of the surface properties of the relief, preferably for the use of specific printing inks,
(viii) optionally further processing steps.

In preferred embodiments re-exposure in step (vii) takes place with UVA light and UVC light. The re-exposure to UVA light and UVC light can take place at the same time (simultaneously) or by turns (alternately).

In the case of re-exposure to UVA light, this is generally done with a dose from 100 to 30,000 mJ/cm$^2$ UVA light. 100 to 20,000 mJ/cm$^2$ UVA light is preferred, 100 to 7,000 mJ/cm$^2$ UVA light more preferred and 500 to 7,000 mJ/cm$^2$ UVA light very preferred.

In the case of re-exposure to UVC light, this is generally done with a dose from 100 to 20,000 mJ/cm$^2$ UVC light. 100 to 20,000 mJ/cm$^2$ UVC light is preferred, 100 to 8,000 mJ/cm$^2$ UVC light more preferred and 500 to 8,000 mJ/cm$^2$ UVC light very preferred.

Re-exposure to UVA light and UVC light may take place simultaneously, consecutively or alternately, whereby the ratio of doses of UVA to UVC light ($D_{UVA}/D_{UVC}$) is generally greater than 0.2, preferably greater than 0.4, more preferably greater than 0.6 and very preferably greater than 0.8. While the exposure to UVC light preferably seals the surface of the layer due to the lower depth of penetration, the exposure to UVA light ensures stronger crosslinking throughout the layer, so that mechanically stable reliefs are obtained.

In the first step (i) the relief precursor previously described is provided. It may optionally be cleaned, in which case all the techniques familiar to the skilled person may be employed, such as, for example, brushing, blowing off, wiping (with and without solvent), washing off and any desired combinations thereof.

The wavelength of the electromagnetic radiation irradiated is in the range from 200 to 2,000 nm, preferably in the UV range, more preferably in the range from 200 to 550 nm, very preferably in the range from 300 to 450 nm. Besides broadband irradiation of the electromagnetic waves, it may be advantageous to use narrowband or monochromatic wavelength ranges of the kind which can be generated using corresponding filters, lasers, or light-emitting diodes (LEDs). In these cases, preferred wavelengths are in the ranges of 350, 365, 385, 395, 400, 405, 532, 830, 1064 nm individually (and around 5-10 nm above and/or below) or as combinations.

Where a cover layer (D) is present, this is removed. Preferably the cover layer is a protective film and is peeled off.

In step (ii), the mask layer is imaged either by removal of the layer and/or by positionally resolved alteration of the absorption and/or reflection properties in such a way that the mask layer becomes at least partly transparent in the wavelength range used for the imaging. The mask layer is ablated preferably by means of high-energy lasers, with laser beams being guided over the mask layer under computer control. Employed primarily in this case are IR lasers having wavelengths in the range from 500 to 20,000 nm, preferably in the range from 800 to 10,000 nm, more preferably in the range from 1,000 to 2,000 nm. Wavelengths of around 830 nm, 980 nm, 1064 nm, and 10.6 µm, or combinations thereof, are especially preferred.

In the optional step (iii) the relief precursor may be irradiated extensively with electromagnetic radiation from at least one side. This irradiation preferably takes place from the side of the relief precursor that is opposite the mask layer, in order to achieve anchoring of the relief structure to be generated (back-side exposure). This back-side exposure takes place preferably through transparent, dimensionally stable materials such as, for example, polymer films, and especially polyester films, as carrier material. In the case of non-transparent carrier materials, step (iii) is omitted.

The exposure of the relief precursor according to the invention to electromagnetic radiation in step (iv-a) through the layer (C) and also optionally the layer (E) triggers a reaction in those regions of the layer (B) that lie beneath the exposed areas of the layer (C), which leads to the crosslinking of the constituents present in the layer. As a result of this crosslinking, these regions are stabilized and cannot be removed in the later development step. The irradiation is generally extensive, but may alternatively be carried out over a small area (virtually dotwise) by means of guided laser beams or positionally resolved projection of electromagnetic radiation. The electromagnetic radiation used for this exposure generally has wavelengths in the range from 200 to 2,000 nm, preferably in the range from 315 to 380 nm.

The irradiation here may take place continuously or in pulsed form or in a plurality of short periods with continuous radiation. The intensity of the radiation here may be varied over a wide range, ensuring that a dose is used which is sufficient to crosslink the layer (B) for the later development procedure. The intensity of the radiation is generally in the range from 10 to 1,000 mW/cm$^2$. The dose of the radiation is generally in the range from 3 to 100 J/cm$^2$, preferably in the range from 6 to 20 J/cm$^2$. Exposure to the energy source may also be carried out in an inert atmosphere, such as in noble gases, $CO_2$ and/or nitrogen, for example, or under a liquid which does not damage the multilayer element.

The direct imaging exposure can be achieved by selectively exposing the regions to be crosslinked. This can, for example, be achieved with one or a plurality of laser beams which are controlled accordingly, through the use of screens on which certain pixels which emit the radiation are activated, through the use of mobile LED strips, through LED arrays in which individual LEDs are deliberately switched on and off, through the use of electronically controllable masks in which pixels which allow the radiation of a radiation source to pass through are rendered transparent, through the use of projection systems in which pixels are exposed to radiation from a radiation source through the corresponding orientation of mirrors, or combinations thereof. Direct exposure by means of controlled laser beams or projection systems with mirrors is preferred. Here the absorption spectra of the initiators or initiator systems and the emission spectra of the radiation sources must at least partially overlap.

In step (v) the layer (C) and, if present, the layer (E) and also the non-crosslinked regions of the layer (B) are removed, thus generating the relief. In step (v) the non-exposed, non-photopolymerised regions of the relief-forming layer may be removed by treatment with a washout medium or by thermal treatment.

The layers may be removed individually or in groups or all together and simultaneously. Preferably all the layers and the non-crosslinked regions of (B) are removed in a single step. Depending on the nature of the layers, this may be accomplished by treatment with solvent-based or water-based washout media, such as for example, organic solvents, mixtures thereof, water, aqueous solutions or aqueous-organic solvent mixtures, which are capable of dissolving, emulsifying and/or dispersing non-crosslinked regions in the layer (B).

In another embodiment, the removal of the layer (C) and, if present, the layer (E) and also of the non-crosslinked regions of the layer (B) in step (v) takes place thermally, in other words by introduction of heat and removal of the softened or partially liquefied material of the layers. The heating of the exposed relief precursor may be carried out by all of the techniques known to the skilled person, such as, for example, irradiation with IR light, the action of hot gases (e.g. air), using hot rollers, or any desired combinations thereof. To remove the (viscously) liquid regions it is possible to employ all techniques and processes familiar to the skilled person, such as, for example, blowing, suction, dabbing, blasting (with particles and/or droplets), stripping, wiping, transfer to a developing medium, and any desired combinations thereof. Preferably the liquid material is taken up (absorbed and/or adsorbed) by a developing medium which is brought into continuous contact with the heated surface of the relief precursor. The procedure is repeated until the desired relief height is reached. Developing media which can be utilised are papers, woven and nonwoven fabrics, and films which are able to take up the liquefied material and may consist of natural fibres and/or polymeric fibres. Preference is given to using nonwovens or non-woven fibre webs of polymers such as celluloses, cotton, polyesters, polyamides, polyurethanes, and any desired combinations thereof, which are stable at the temperatures employed when developing.

The object of the invention is also a method for the production of an optimised relief structure, in which the method is performed multiple times with the steps (i) to (viii), whereby in step (vii) the re-exposure to UVA light and/or UVC light is varied in respect of the dose and/or of the chronological sequence of the UVA and UVC re-exposure steps in order to optimise the surface properties of the relief.

The object of the invention is also the relief structures which can be obtained according to the methods described above, and the use thereof. The relief structures may be used as a pad printing plate, flexographic plate, letterpress plate, gravure plate, microfluidic component, microreactor, photoretic cell, photonic crystal or optical component. In the case of microfluidic components or microreactors, it may be advantageous to make the surface properties hydrophobic for the use of aqueous or very polar fluids, in order to reduce interactions with the walls or generate a hydrophilic surface when using nonpolar fluids. In the case of phoretic cells, photonic crystals or optical components, it may be advantageous in respect of contamination and cleaning to make the surface hydrophobic or hydrophilic, respectively.

The invention is elucidated in more detail by the examples below.

EXAMPLES

Methods:
Evaluation of the Inflow

To evaluate the inflow, the plates were assessed after about 1,000 linear metres of printing by assessing the tonal value fields from 10% to 50%. A significant inflow (a lot of ink in the interstitial spaces) was given the classification "—", moderate inflow the classification "0" and little to no inflow (no ink in the interstitial spaces) the classification "+".

Method for Gloss Measurement

Figure 2:
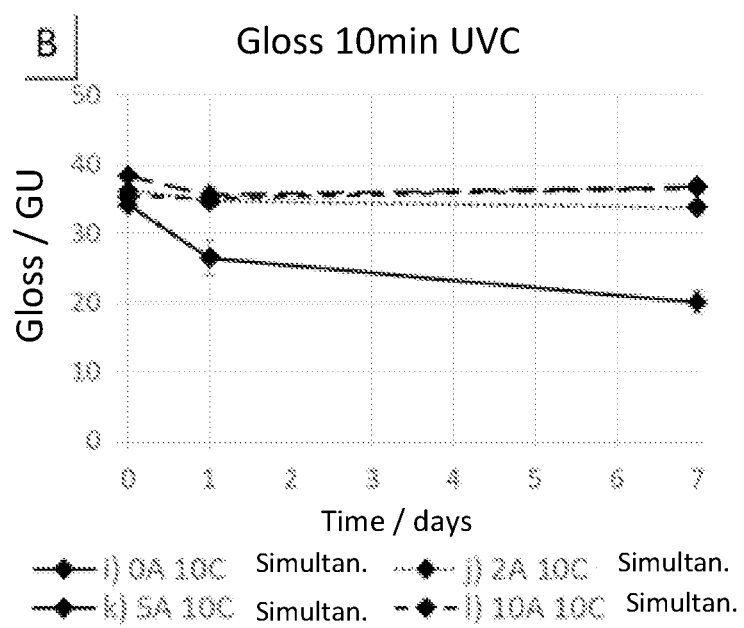
Figure 3:
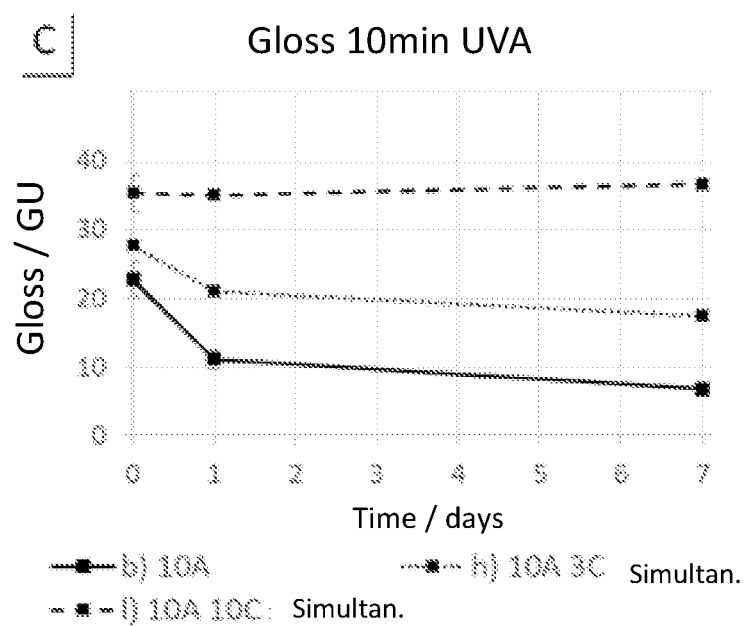

Gloss measurements were carried out to provide evidence for a migration-capable, surface-active additive (MSA) on the surface of the plate. The gloss was measured with the aid of a micro-TRI-gloss µ gloss meter (BYK—Gardner GmbH) at a glancing angle of 60°. The gloss meter was calibrated prior to the measurements with the aid of the integrated calibration standard. The result is the mean of three measurements at each of different points on the surface of the plate. Removal of the MSA by cleaning the surface with solvent leads to an increase in the gloss to 40-50 GU FIGS. 1 to 3 show the development of the gloss in gloss units (GU) as a function of the time in days for different re-exposure times.

Method for IR Measurement

FT-IR measurements were carried out to provide evidence of the MSA on the surface of the plate. A tensor 27 FT-IR (Bruker) equipped with a PIKE MIRacle Diamant/ZnSe ATR-IR unit (PIKE Technologies) was used for the FT-IR measurements on the surface of the plate. The data were captured and analysed with the aid of the Opus software, version 7.5 (Bruker). Background correction of the spectra was performed automatically. The integrals of the IR bands at 719 and 729 cm$^{-1}$ were used as the measure for the presence of the MSA. To that end they were standardised to the integral of the IR-band at 1730 cm$^{-1}$ and the zero value (result without MSA) was then subtracted. The signals attributable to the MSA were determined by IR spectroscopy of the pure substance. Following removal of the MSA by cleaning the surface with solvent, the signals attributable to the MSA in the IR spectrum are no longer visible.

Figure 4:
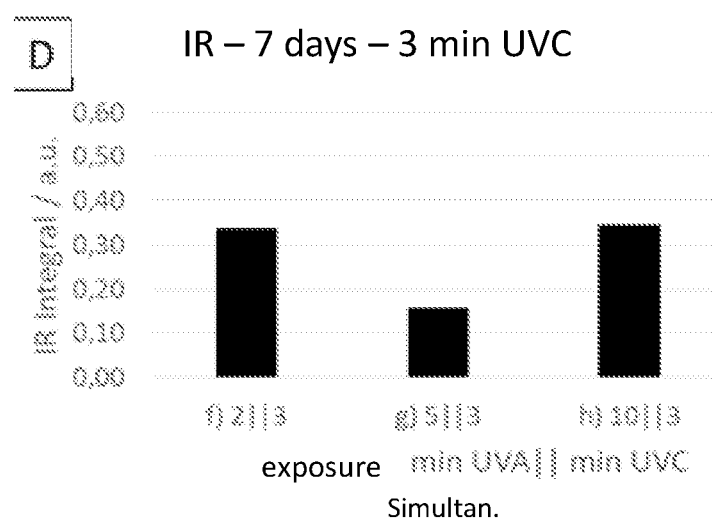
Figure 5:
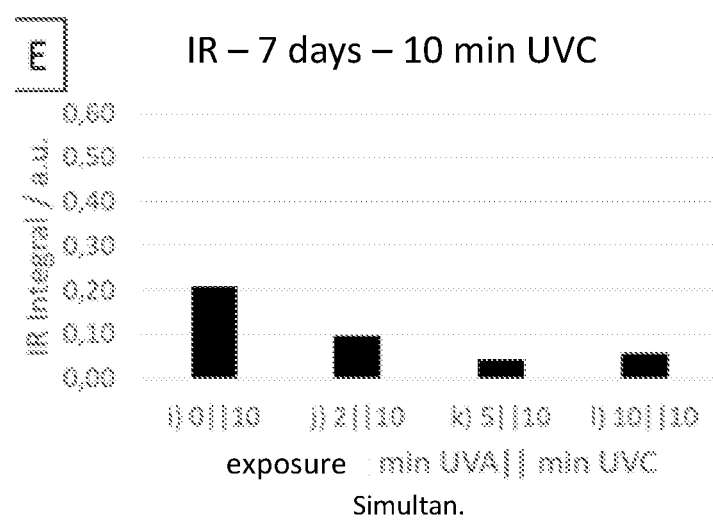
Figure 6:
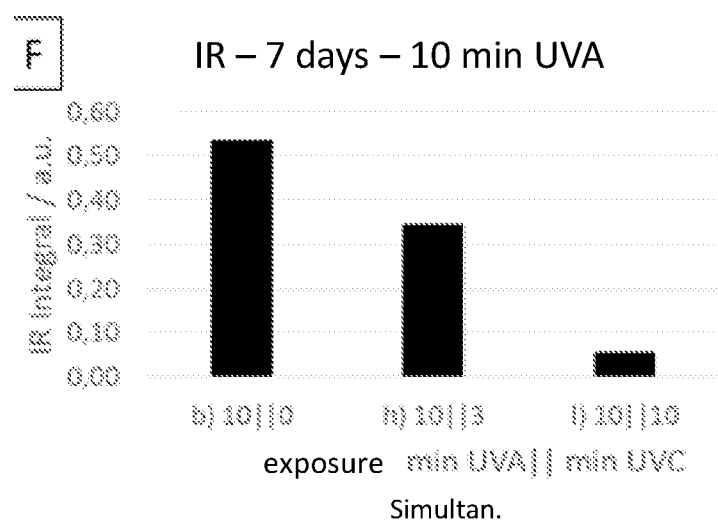

FIGS. 4 to 6 show the integrals of the IR bands at 719 and 729 cm$^{-1}$ after 7 days for the given re-exposure times.

Method for Contact Angle Measurement

The effect of the MSA on the wetting of the surface with water was investigated by means of contact angle measurements. To that end a drop of 10 µL of demineralised water was dropped onto the surface of a printing plate. The profile of the water droplet was captured by means of the Keyence VHX-500F light microscope using the VH-Z20R lens and the VH-S30 tripod. The radius r and the height h of the droplet were measured from these captures by means of the associated software. The contact angle θ was calculated using trigonometry (equation 1).

$$\theta = \arccos\left(1 - \frac{h}{r}\right) \tag{1}$$

Example 1

An SBS-based relief precursor (overall thickness 1.14 mm) was produced on a polyester carrier with 1% by weight of a paraffin wax (>C20) having a melting point of 50-57° C. as MSA and 2% by weight of benzil-α,α-dimethyl acetal (IGM Resins B.V.). The relief precursor was exposed from the back for 25 seconds with an intensity of 16 mW/cm$^2$ in a Nyloflex® Combi FIII exposure unit (Flint Group) by means of fluorescent tubes (Philips TL 80W/10-R). After the protective film was peeled off, the precursor was imaged in a ThermoFlexX 20 (Xeikon) and subsequently exposed through the mask layer for 15 minutes with an intensity of 16 mW/cm$^2$ at 40° C. in a Nyloflex® Combi FIII exposure unit (Flint Group) by means of fluorescent tubes (Philips TL 80W/10-R). The exposed precursor was washed out in a Nyloflex® Digital Washer FIII (Flint Group) by means of nylosolv A and at a rate of 220 mm/min. Drying took place at 60° C. over 120 minutes. Different re-exposures were then carried out in a Nyloflex® Combi FIII exposure unit, whereby no, only UVA (Philips TL 60W/10-R, intensity 11 mW/cm$^2$), only UVC (Philips TUV 75W HO G75 T8, intensity 13 mW/cm$^2$), sequential and simultaneous UVA and UVC exposures were used, in each case at 40° C. In this context simultaneous means that both exposures (with UVA and UVC) were started at the same time. IR and gloss measurements on the printing surfaces thus formed were then carried out at intervals of time. The reference did not contain any MSA. 1A means 1 min of re-exposure to UVA light, 1C means 1 min of re-exposure to UVC light.

FIGS. 1, 2 and 3 show the progression of the gloss on the surfaces of the printing plates over time under various re-exposure conditions. As the MSA diffuses onto the surface, the gloss value falls. When compared with FIGS. 4, 5 and 6, it can be seen that a decline in the gloss value is associated with an increase in the IR signal. With 3 min of re-exposure to UVC (FIG. 1), no clear influence of the UVA re-exposure time on the MSA migration is yet discernible. With 10 min of re-exposure to UVC (FIG. 2), the amount of MSA reduces sharply as the re-exposure time rises. The influence of the re-exposure to UVC on the migration of the MSA is felt at its strongest when combined with 10 min of re-exposure to UVA. In the case of 10 min of exposure to UVA and 10 min of re-exposure to UVC, much less MSA reaches the printing surface than is the case for 10 min of re-exposure to UVA without exposure to UVC (FIG. 3). The properties of the printing surface can thus be controlled.

TABLE 1

IR integrals and gloss on the printing surface after 2 days

| Example | Designation | UVA time (min) | UVA dose (mJ/cm$^2$) | UVC time (min) | UVC dose (mJ/cm$^2$) | UVA/ UVC | IR (a.u.) | Gloss (GU) | 1/ gloss (1/GU) |
|---|---|---|---|---|---|---|---|---|---|
| Reference 1 | No MSA | 10 | 6600 | 0 | 0 | >100 | 0.00 | 41 | 0.025 |
| Example 1a | No re-exposure | 0 | 0 | 0 | 0 | >100 | 0.71 | 16 | 0.062 |

TABLE 1-continued

IR integrals and gloss on the printing surface after 2 days

| Example | Designation | UVA time (min) | UVA dose (mJ/cm$^2$) | UVC time (min) | UVC dose (mJ/cm$^2$) | UVA/ UVC | IR (a.u.) | Gloss (GU) | 1/ gloss (1/GU) |
|---|---|---|---|---|---|---|---|---|---|
| Example 1b | 10A | 10 | 6600 | 0 | 0 | >100 | 0.32 | 12 | 0.086 |
| Example 1c | 5C | 0 | 0 | 5 | 3900 | 0.0 | 0.05 | 32 | 0.031 |
| Example 1d | 10A5C simultaneous | 10 | 6600 | 5 | 3900 | 1.7 | 0.08 | 32 | 0.031 |
| Example 1e | 10A10C simultaneous | 10 | 6600 | 10 | 7800 | 0.8 | 0.02 | 35 | 0.028 |

Table 1 shows the IR integrals and gloss on the printing surface after 2 days as a function of the re-exposure conditions. The greater the value of the IR integral, the more MSA there is on the surface of the plate. The IR integral correlates with the reciprocal of the gloss. A low gloss is evidence of the presence of MSA on the surface. In the absence of MSA, no MSA can be found by means of IR spectroscopy. In the case of 10 min of exposure to UVA and 10 min of re-exposure to UVC, much less MSA reaches the printing surface than is the case without re-exposure or for 10 min of re-exposure to UVA without exposure to UVC. The properties of the printing surface can thus be controlled.

TABLE 2

IR integrals and gloss on the printing surface after 7 days

| Example | Designation | UVA time (min) | UVA dose (mJ/cm$^2$) | UVC time (min) | UVC dose (mJ/cm$^2$) | UVA/ UVC | IR (a.u.) | Gloss (GU) | 1/ gloss (1/GU) |
|---|---|---|---|---|---|---|---|---|---|
| Reference 1 | No MSA, 10A | 10 | 6600 | 0 | 0 | >100 | 0 | 40 | 0.025 |
| Example 1a | No re-exposure | 0 | 0 | 0 | 0 | >100 | 0.79 | 9 | 0.107 |
| Example 1b | 10A | 10 | 6600 | 0 | 0 | >100 | 0.54 | 7 | 0.147 |
| Example 1f | 2A3C simultaneous | 2 | 1320 | 3 | 2340 | 0.6 | 0.34 | 14 | 0.070 |
| Example 1g | 5A3C simultaneous | 5 | 1500 | 3 | 2340 | 1.4 | 0.16 | 16 | 0.063 |
| Example 1h | 10A3C simultaneous | 10 | 3000 | 3 | 2340 | 2.8 | 0.35 | 17 | 0.057 |
| Example 1i | 10C | 0 | 0 | 10 | 7800 | 0.0 | 0.21 | 20 | 0.050 |
| Example 1j | 2A10C simultaneous | 2 | 1320 | 10 | 7800 | 0.2 | 0.10 | 34 | 0.030 |
| Example 1k | 5A10C simultaneous | 5 | 3300 | 10 | 7800 | 0.4 | 0.04 | 37 | 0.027 |
| Example 1l | 10A10C simultaneous | 10 | 6600 | 10 | 7800 | 0.8 | 0.06 | 37 | 0.027 |

Table 2 shows the influence of the UVA and UVC exposure on the presence of the MSA on the surface of the plate. The duration of 7 days was chosen in order to verify that the MSA does not actually reach the surface. Reference 1 shows the values arising without MSA. The less UVA and UVC light was applied to printing plates with MSA, the more MSA is present on the surface after 7 days. The influence of UVC light here is greater than that of UVA light. The values that were obtained for the combination of UVA and UVC re-exposure correspond to the values of a printing plate without MSA.

Example 2 a) An SIS-based relief precursor (thickness 1.14 mm) was produced on a polyester carrier with 1% by weight of a paraffin wax (>C35) having a melting point of 58° C. as MSA and 5% by weight of benzil-α,α-dimethyl acetal (IGM Resins B.V.) and 0.5% by weight of 1-hydroxycyclohexylphenyl ketone (IGM Resins B.V.).

b) A second relief precursor, but without 1-hydroxycyclohexylphenyl ketone, was likewise produced as under a).

Both plate types were exposed from the back for 15 seconds (a) and 10 seconds (b) with an intensity of 16 mW/cm$^2$ in a Nyloflex® Combi FIII exposure unit (Flint Group) by means of fluorescent tubes (Philips TL 80W/10-R). After the protective film was peeled off, the precursors were imaged in a ThermoFlexX 20 (Xeikon) and subsequently exposed through the mask layer for 15 minutes with an intensity of 16 mW/cm$^2$ at 40° C. in a Nyloflex® Combi FIII exposure unit (Flint Group) by means of fluorescent tubes (Philips TL 80W/10-R). The precursors were washed out in a Nyloflex® Digital Washer FIII (Flint Group) by means of nylosolv A and at a rate of 200 mm/min. Drying took place at 60° C. over 120 minutes. Different re-exposures were then carried out at 40° C. in a Nyloflex® Combi FIII exposure unit, whereby UVA and UVC exposures were used in parallel and started simultaneously. In the former case, there was 10 minutes of UVA exposure (Philips TL 60W/10-R) with an intensity of 11 mW/cm$^2$ and 3 minutes of UVC exposure (Philips TUV 75W HO G75 T8) with an intensity of 13 mW/cm$^2$. In the latter case, there was 10 minutes of UVA exposure and 10 minutes of UVC exposure. Gloss measurements on the non-printed areas thus formed (floor) were then carried out at intervals of time.

TABLE 3

Gloss after 3 days and inflow of the printing plates with solvent-based ink (LM)

| | Exposure | UVA dose (mJ/cm$^2$) | UVC dose (mJ/cm$^2$) | UVA/UVC | Gloss (GU) | 1/gloss (1/GU) | Inflow with LM |
|---|---|---|---|---|---|---|---|
| Reference 1 | No MSA, 10A | 6600 | 0 | >100 | 130 | 0.008 | – |
| Example 2a | Nore-exposure | 0 | 0 | >100 | 101 | 0.010 | + |
| Example 2b | 10A3Cp | 6600 | 2340 | 2.8 | 99 | 0.010 | + |
| Example 2c | 10A10Cp | 6600 | 7800 | 0.8 | 110 | 0.009 | – |

Table 3 shows the gloss on the surface of the printing plate after 3 days and the inflow of the printing plates after printing with solvent-based ink (LM).

Without re-exposure (example 2a) or with 10 min of UVA and 3 min of UVC re-exposure (example 2b), a lower gloss value is observed than is the case with 10 min of UVA and 10 min of UVC re-exposure (example 2c). This indicates the presence of MSA on the surface of the floor. In the print test the printing plates from examples 2a and 2b exhibit reduced inflow.

Example 3 a. An SBS-based relief precursor (thickness 1.14 mm) was produced on a polyester carrier with 1% by weight of a paraffin wax (>C35) having a melting point of 58° C. as MSA and 2% by weight of benzil-α,α-dimethyl acetal (IGM Resins B.V.). This was exposed from the back for 26 seconds with an intensity of 19 mW/cm$^2$ in a Next FV exposure unit (Flint Group) by means of fluorescent tubes (Light Emission Tech F100T12/10-R 100W). After the protective film was peeled off, the precursor was imaged in a CDI 2530 (Esko) and subsequently exposed through the mask layer for 10 minutes with an intensity of 19 mW/cm$^2$ in a Next FV exposure unit (Flint Group) by means of fluorescent tubes (Light Emission Tech F100T12/10-R 100W). The precursor was developed in a Nyloflex® Flowline Washer FV (Flint Group) by means of nylosolv A (Flint Group) and at a rate of 255 mm/min Drying took place at 60° C. over 120 minutes. Re-exposure then took place at room temperature, with the UVA exposure (Philips TL 80W/10-R SLV G13, intensity 12 mW/cm$^2$) and UVC exposure (Philips TUV TL-D 95W HO SLV/25, intensity 11 mW/cm$^2$) being started simultaneously and performed in parallel. The UVA exposure time was 10 minutes and the UVC exposure time was increased from 0 to 10 minutes at intervals of 2 minutes.

b. An SBS-based relief precursor (thickness 1.14 mm) was produced on a polyester carrier with 1% by weight of a paraffin wax (>C35) having a melting point of 58° C. as MSA and 5% by weight of benzil-α,α-dimethyl acetal (IGM Resins B.V.). This was exposed from the back for 14 seconds with an intensity of 19 mW/cm$^2$ in a Next FV exposure unit (Flint Group) by means of fluorescent tubes (Light Emission Tech F100T12/10-R 100W). After the protective film was peeled off, the precursor was imaged in a CDI 2530 (Esko) and subsequently exposed through the mask layer for 8 minutes with an intensity of 19 mW/cm$^2$ in a Next FV exposure unit (Flint Group) by means of fluorescent tubes (Light Emission Tech F100T12/10-R 100W). The precursor was developed in a Nyloflex® Flowline Washer FV (Flint Group) by means of nylosolv A (Flint Group) and at a rate of 285 mm/min Drying took place at 60° C. over 120 minutes. Re-exposure then took place at room temperature, with the UVA exposure (Philips TL 80W/10-R SLV G13, intensity 12 mW/cm$^2$) and UVC exposure (Philips TUV TL-D 95W HO SLV/25, intensity 11 mW/cm$^2$) being started simultaneously and performed in parallel. The UVA exposure time was 8 minutes and the UVC exposure time was increased from 0 to 10 minutes at intervals of 2 minutes.

c. An SBS-based relief precursor (thickness 1.14 mm) was produced on a polyester carrier with 1% by weight of a paraffin wax (>C35) having a melting point of 58° C. as MSA and 5% by weight of benzil-α,α-dimethyl acetal (IGM Resins B.V.). This was exposed from the back for 26 seconds with an intensity of 19 mW/cm$^2$ in a Next FV exposure unit (Flint Group) by means of fluorescent tubes (Light Emission Tech F100T12/10-R 100W). After the protective film was peeled off, the precursor was imaged in a CDI 2530 (Esko) and subsequently exposed through the mask layer in a Next FV exposure unit (Flint Group) by means of the UV LED strip with 3×250 mm/min and an intensity of 800 mW/cm$^2$. The precursor was developed in a Nyloflex® Flowline Washer FV (Flint Group) by means of nylosolv A (Flint Group) and at a rate of 255 mm/min. Drying took place at 60° C. over 120 minutes. Re-exposure then took place at room temperature, with the UVA exposure (Philips TL 80W/10-R SLV G13, intensity 12 mW/cm$^2$) and UVC exposure (Philips TUV TL-D 95W HO SLV/25, intensity 11 mW/cm$^2$) being started simultaneously and performed in parallel. The UVA exposure time was 8 minutes and the UVC exposure time was increased from 0 to 10 minutes at intervals of 2 minutes.

Print Parameters:

A solvent-based ink, Flexistar MV Process Cyan (Flint Group), was printed by means of an F&K Flexpress 6S/8 printing machine (Fischer & Krecke) on an LDPE film (Delo) pretreated with corona on one side and having a width of 400 mm and thickness of 55 μm. A Lohmann 5.3 foam adhesive tape (Lohmann) was used to fasten the printing plates. The anilox roller used was provided with a screen resolution of 420 lines/cm and a volume of 3.5 cm$^3$/m$^2$. The print speed was 200 m/min, with a lateral feed of 70 μm for the printing unit and 60 μm for the screen roller. Drying took place in 2 stages at 40° C. and 60° C.

TABLE 4

Inflow of the printing plate in various ratios of simultaneous UVA to UVC re-exposure

| Example | UVA exp. time (min) | UVA exp. dose (mJ/cm$^2$) | UVC exp. time | UVC exp. dose | UVA/UVC | Inflow with LM ink |
|---|---|---|---|---|---|---|
| 3a | 10 | 7200 | 0 | 0 | >100 | + |
| | 10 | 7200 | 2 | 1320 | 5.5 | + |
| | 10 | 7200 | 4 | 2640 | 2.7 | 0 |
| | 10 | 7200 | 6 | 3960 | 1.8 | 0 |
| | 10 | 7200 | 8 | 5280 | 1.4 | – |
| | 10 | 7200 | 10 | 6600 | 1.1 | – |

TABLE 4-continued

Inflow of the printing plate in various ratios of simultaneous UVA to UVC re-exposure

| Example | UVA exp. time (min) | UVA exp. dose (mJ/cm$^2$) | UVC exp. time | UVC exp. dose | UVA/ UVC | Inflow with LM ink |
|---|---|---|---|---|---|---|
| 3b | 8 | 5760 | 0 | 0 | >100 | + |
|  | 8 | 5760 | 2 | 1320 | 4.4 | + |
|  | 8 | 5760 | 4 | 2640 | 2.2 | 0 |
|  | 8 | 5760 | 6 | 3960 | 1.5 | 0 |
|  | 8 | 5760 | 8 | 5280 | 1.1 | − |
|  | 8 | 5760 | 10 | 6600 | 0.9 | − |
| 3c | 8 | 5760 | 0 | 0 | >100 | + |
|  | 8 | 5760 | 2 | 1320 | 4.4 | + |
|  | 8 | 5760 | 4 | 2640 | 2.2 | 0 |
|  | 8 | 5760 | 6 | 3960 | 1.5 | 0 |
|  | 8 | 5760 | 8 | 5280 | 1.1 | − |
|  | 8 | 5760 | 10 | 6600 | 0.9 | − |

+ = no inflow,
0 = little inflow,
− = significant inflow

Table 4 shows the evaluation of the inflow of the printing plate after printing with solvent-based ink in various ratios of simultaneous UVA to UVC re-exposure. The higher the UVC re-exposure dose applied, i.e. the smaller the ratio of the doses from UVA to UVC re-exposure, the greater the observed inflow of the interstitial spaces of the printing plate. With a moderate UVC re-exposure dose, on the other hand, inflow of the interstitial spaces is largely avoided through migration of the MSA.

Example 4

MSA Migration

An SIS-based relief precursor (thickness 1.14 mm) was produced on a polyester carrier with 1% by weight of a paraffin wax (>C35) having a melting point of 58° C. as MSA and 5% by weight of benzil-α,α-dimethyl acetal (IGM Resins B.V.). This was exposed from the back for 14 seconds with an intensity of 28 mW/cm$^2$ in a Combi FIII exposure unit (Flint Group) by means of fluorescent tubes (Philips TL 60 W/10-R). After the protective film was peeled off, the precursor was imaged in a CDI 2530 (Esko) and subsequently exposed through the mask layer for 8 minutes with an intensity of 19 mW/cm$^2$ in a Next FV exposure unit (Flint Group) by means of fluorescent tubes (Light Emission Tech F100T12/10-R 100W). The precursor was developed in a Nyloflex® Flowline Washer FV (Flint Group) by means of nylosolv A (Flint Group) and at a rate of 290 mm/min. Drying took place at 60° C. over 120 minutes. Re-exposure then took place at room temperature, with the UVA exposure (Philips TL 80 W/10-R SLV G13, intensity 12 mW/cm$^2$) and UVC exposure (Philips TUV TL-D 95 W HO SLV/25, intensity 11 mW/cm$^2$) being started simultaneously and performed in parallel. The UVA exposure time was 8 minutes and the UVC exposure time 0 and 2 minutes.

UV-Curing Ink Print Parameters:

An MO4 printing machine with FA4 flexo units (Nilpeter) was used for printing with the Flexocure Force UV-curing ink (Flint Group). The print medium used was PE-based self-adhesive label material (Raflatac) of width 330 mm and thickness 130 μm or paper-based self-adhesive label material (Raflacoat, UPM) of width 330 mm and thickness 120 μm. A Tesa Blue foam adhesive tape of moderate hardness (Tesa) was used to secure the printing plates. The anilox roller used was provided with a screen resolution of 500 lines/cm and a volume of 2.5 cm$^3$/m$^2$. The print speed was 100 m/min

TABLE 5

Effects of the MSA when printing with UV-curing inks on PE film or paper

| Example 4 | UVA exp. time (min) | UVA exp. dose (mJ/cm$^2$) | UVC exp. time | UVC exp. dose | UVA/ UVC | Full-tone colour density | Leading edges |
|---|---|---|---|---|---|---|---|
| PE film | 8 | 5760 | 0 | 0 | >100 | 1.40 | Not determined |
|  | 8 | 5760 | 2 | 1320 | 4.4 | 1.34 | Not determined |
| Paper | 8 | 5760 | 0 | 0 | >100 | Not determined | No leading edges |
|  | 8 | 5760 | 2 | 1320 | 4.4 | Not determined | Strong leading edges |

Table 5 shows the effects of the MSA when printing with UV-curing inks on PE film or paper. With UVC re-exposure, less MSA diffuses onto the surface of the printing plate. When printing on PE film, the absence of MSA resulted in a reduced full-tone colour density being observed; when printing on paper, the occurrence of leading edges. Without UVC re-exposure, the MSA diffuses onto the surface of the printing plate and favours the transfer of ink onto the relevant print medium. When printing on PE film, the presence of MSA resulted in an increase in the full-tone colour density being observed; when printing on paper, the disappearance of the leading edges.

Example 5

An SBS-based relief precursor (thickness 1.14 mm) was produced on a polyester carrier with 0.1 or 2.5% by weight of a paraffin wax (>C35) having a melting point of 58° C. as MSA and 5% by weight of benzil-α,α-dimethyl acetal (IGM Resins B.V.). This was exposed from the back for 17 seconds with an intensity of 28 mW/cm$^2$ in a Combi FIII exposure unit (Flint Group) by means of fluorescent tubes (Philips TL 60 W/10-R). After the protective film was peeled off, the precursor was imaged in a CDI 2530 (Esko) and subsequently exposed through the mask layer for 8 minutes with an intensity of 28 mW/cm$^2$ in a Combi FIII exposure unit (Flint Group) by means of fluorescent tubes (Philips TL 60 W/10-R). The precursor was developed in a Nyloflex® Flowline Washer FV (Flint Group) by means of Cyrel® Flexosol-i (DuPont) as washout medium and at a rate of 250 mm/min. Drying took place at 60° C. over 120 minutes. Re-exposure then took place at room temperature, with the UVA exposure (Philips TL 80W/10-R SLV G13, intensity 12 mW/cm$^2$) and UVC exposure (Philips TUV TL-D 95W HO SLV/25, intensity 11 mW/cm$^2$) being started simultaneously and performed in parallel. The UVA exposure time was 8 minutes and the UVC exposure time 2 minutes.

Print Conditions:

A solvent-based ink, Flexistar MV Process Cyan (Flint Group), was printed by means of an F&K Flexpress 6S/8 printing machine (Fischer & Krecke) on an LD-PE film (Delo) pretreated with corona on one side and having a width of 400 mm and thickness of 55 μm. A Lohmann 5.3 foam adhesive tape (Lohmann) was used to fasten the printing plates. The anilox roller used was provided with a screen resolution of 420 lines/cm and a volume of 3.5 cm$^3$/m$^2$. The print speed was 200 m/min

TABLE 6

| Example | MSA conc. (%) | UVA exp. time (min) | UVA exp. dose (mJ/cm$^2$) | UVC exp. time (min) | UVC exp. dose (mJ/cm$^2$) | UVA/ UVC | Inflow |
|---|---|---|---|---|---|---|---|
| Reference 5a | 0 | 8 | 5760 | 2 | 1320 | 4.4 | -- |
| Example 5b | 1 | 8 | 5760 | 2 | 1320 | 4.4 | + |
| Example 5c | 2.5 | 8 | 5760 | 2 | 1320 | 4.4 | + |

Very significant inflow=−−
Significant inflow=−
Moderate inflow=0
Little inflow=+
No inflow=++

In reference 5a, significant inflow of the plate was observed. The inflow was reduced sharply through the addition of the MSA (examples 5b and 5c (Table 6).

Example 6

An SBS-based relief precursor (thickness 1.14 mm) was produced on a polyester carrier with 1% by weight of a paraffin wax (>C35) having a melting point of 58° C. as MSA and 5% by weight of benzil-α,α-dimethyl acetal (IGM Resins B.V.) and 0%; 0.25% or 0.5% of a 1-hydroxycyclohexylphenyl ketone (C1) or 0.5% of a mixture of oxyphenyl acetic acid 2-[2-oxo-2-phenylacetoxy ethoxylethylester and oxyphenyl acetic acid-2-[2-hydroxyethoxylethylester (C2) (each IGM Resins B.V.). This was exposed from the back for 22 seconds with an intensity of 28 mW/cm$^2$ in a Combi FIII exposure unit (Flint Group) by means of fluorescent tubes (Philips TL 60 W/10-R). After the protective film was peeled off, the precursor was imaged in a CDI 2530 (Esko) and subsequently exposed through the mask layer for 10 minutes with an intensity of 28 mW/cm$^2$ in a Combi FIII exposure unit (Flint Group) by means of fluorescent tubes (Philips TL 60 W/10-R). The precursor was developed in a Nyloflex® Flowline Washer FV (Flint Group) by means of Cyrel® Flexosol-i (DuPont) as washout medium and at a rate of 250 mm/min. Drying took place at 60° C. over 120 minutes. Re-exposure then took place at room temperature, with the UVA exposure (Philips TL 80W/10-R SLV G13, intensity 12 mW/cm$^2$) and UVC exposure (Philips TUV TL-D 95W HO SLV/25, intensity 11 mW/cm$^2$) being started simultaneously and performed in parallel. The UVA exposure time was 8 minutes and the UVC exposure time 2 minutes.

Print Conditions:

A solvent-based ink, Flexistar MV Process Cyan (Flint Group), was printed by means of an F&K Flexpress 6S/8 printing machine (Fischer & Krecke) on an LD-PE film (Delo) pretreated with corona on one side and having a width of 400 mm and thickness of 55 μm. A Lohmann 5.3 foam adhesive tape (Lohmann) was used to fasten the printing plates. The anilox roller used was provided with a screen resolution of 420 lines/cm and a volume of 3.5 cm$^3$/m$^2$. The print speed was 200 m/min

TABLE 7

| Example | UVC initiator | UVC initiator conc. (%) | UVA/ UVC initiator | MSA conc. (%) | Inflow |
|---|---|---|---|---|---|
| Reference 6a | – | 0 | – | 0 | -- |
| Example 6b | – | 0 | – | 1 | 0 |
| Example 6c | C1 | 0.05 | 100 | 1 | + |

TABLE 7-continued

| Example | UVC initiator | UVC initiator conc. (%) | UVA/ UVC initiator | MSA conc. (%) | Inflow |
|---|---|---|---|---|---|
| Example 6d | C1 | 0.1 | 50 | 1 | + |
| Example 6e | C1 | 0.2 | 25 | 1 | + |
| Example 6f | C2 | 0.5 | 10 | 1 | + |

Very significant inflow=−−
Significant inflow=−
Moderate inflow=0
Little inflow=+
No inflow=++

Without MSA or a UVC photoinitiator (reference 6a) significant inflow of the plate is observed. The addition of an MSA and a UVC photoinitiator reduces the inflow sharply. With this plate formulation, inflow is also reduced through the addition of 0.5% UVC photoinitiator C2 (Table 7).

Example 7

An SIS-based relief precursor (thickness 1.14 mm) was produced on a polyester carrier with 1% by weight of a paraffin wax (>C35) having a melting point of 58° C. as MSA, 5% by weight of benzil-α,α-dimethyl acetal (IGM Resins B.V.) and 0%, 0.25% or 0.5% of a 1-hydroxycyclohexylphenyl ketone (C1) (IGM Resins B.V.). This was exposed from the back for 14 seconds with an intensity of 28 mW/cm$^2$ in a Combi FIII exposure unit (Flint Group) by means of fluorescent tubes (Philips TL 60 W/10-R). After the protective film was peeled off, the precursor was imaged in a CDI 2530 (Esko) and subsequently exposed through the mask layer for 8 minutes with an intensity of 28 mW/cm$^2$ in a Combi FIII exposure unit (Flint Group) by means of fluorescent tubes (Philips TL 60 W/10-R). The precursor was developed in a Nyloflex® Flowline Washer FV (Flint Group) by means of Cyrel® Flexosol-i (DuPont) as washout medium and at a rate of 150 mm/min. Drying took place at 60° C. over 120 minutes. Re-exposure then took place at room temperature, with the UVA exposure (Philips TL 80W/10-R SLV G13, intensity 12 mW/cm$^2$) and UVC exposure (Philips TUV TL-D 95W HO SLV/25, intensity 11 mW/cm$^2$) being started simultaneously and performed in parallel. The UVA exposure time was 8 minutes and the UVC exposure time 2 minutes.

Print Conditions:

A solvent-based ink, Flexistar MV Process Cyan (Flint Group), was printed by means of an F&K Flexpress 6S/8 printing machine (Fischer & Krecke) on an LD-PE film (Delo) pretreated with corona on one side and having a width of 400 mm and thickness of 55 μm. A Lohmann 5.3 foam adhesive tape (Lohmann) was used to fasten the printing plates. The anilox roller used was provided with a screen resolution of 420 lines/cm and a volume of 3.5 cm$^3$/m$^2$. The print speed was 200 m/min

TABLE 8

| Example | UVC initiator C1 conc. (%) | UVA/ UVC initiator | MSA conc. (%) | Inflow |
|---|---|---|---|---|
| Reference 7a | 0 | – | 1 | -- |
| Example 7b | 0.25 | 8 | 1 | 0 |
| Example 7c | 0.5 | 4 | 1 | + |

Very significant inflow=--
Significant inflow=-
Moderate inflow=0
Little inflow=+
No inflow=++

The inflow is reduced by increasing the UVC photoinitiator content while keeping the UVA photoinitiator content the same. With 0.5% UVC photoinitiator (example 7c), hardly any inflow is observed (Table 8).

Example 8

An SIS-based relief precursor (thickness 1.70 mm) was produced on a polyester carrier with 1% by weight of a paraffin wax (>C35) having a melting point of 58° C., 5% by weight of benzil-α,α-dimethyl acetal (IGM Resins B.V.) and 0%, 0.25% or 0.5% of a 1-hydroxycyclohexylphenyl ketone (C1) (IGM Resins B.V.). This was exposed from the back for 40 seconds with an intensity of 28 mW/cm$^2$ in a Combi FIII exposure unit (Flint Group) by means of fluorescent tubes (Philips TL 60 W/10-R). After the protective film was peeled off, the precursor was imaged in a CDI 2530 (Esko) and subsequently exposed through the mask layer for 8 minutes with an intensity of 28 mW/cm$^2$ in a Combi FIII exposure unit (Flint Group) by means of fluorescent tubes (Philips TL 60 W/10-R). The precursor was developed in a Nyloflex® Flowline Washer FV (Flint Group) by means of nylosolv A (Flint Group) as washout medium and at a rate of 230 mm/min. Drying took place at 60° C. over 120 minutes. Re-exposure then took place at room temperature, with the UVA exposure (Philips TL 80W/10-R SLV G13, intensity 12 mW/cm$^2$) and UVC exposure (Philips TUV TL-D 95W HO SLV/25, intensity 11 mW/cm$^2$) being started simultaneously and performed in parallel. The UVA exposure time was 8 minutes and the UVC exposure time 4 minutes.

Print Conditions:

A solvent-based ink, Flexistar MV Process Cyan (Flint Group), was printed by means of an F&K Flexpress 6S/8 printing machine (Fischer & Krecke) on an LD-PE film (Delo) pretreated with corona on one side and having a width of 400 mm and thickness of 55 μm. A Lohmann 5.3 foam adhesive tape (Lohmann) was used to fasten the printing plates. The anilox roller used was provided with a screen resolution of 420 lines/cm and a volume of 3.5 cm$^3$/m$^2$. The print speed was 200 m/min.

TABLE 9

| Example | UVC initiator C1 conc. (%) | UVA/ UVC initiator | MSA conc. (%) | Inflow |
|---|---|---|---|---|
| Reference 8a | 0 | – | 0 | -- |
| Example 8b | 0.5 | 10 | 1 | + |
| Example 8c | 1.0 | 5 | 1 | + |

Very significant inflow=--
Significant inflow=-
Moderate inflow=0
Little inflow=+
No inflow=++

When compared with reference 8a, the inflow of the plate was reduced sharply through the addition of the MSA and the photoinitiator C1 (examples 8b and 8c). A further increase in the UVC photoinitiator content from 0.5% (example 8b) to 1% (example 8c) does not result in a further improvement with regard to inflow (Table 9).

Example 9

An SBS-based relief precursor (thickness 1.70 mm) was produced on a polyester carrier with 1% by weight of a paraffin wax (>C35) having a melting point of 58° C., 1% by weight of benzil-α,α-dimethyl acetal (IGM Resins B.V.) and 0%; 0.5%; 1.0%; 1.5% or 2.0% of 1-(4-methyllphenyl)-1-dodecanon (C3) (BASF). This was exposed from the back for 40 seconds with an intensity of 28 mW/cm$^2$ in a Combi FIII exposure unit (Flint Group) by means of fluorescent tubes (Philips TL 60 W/10-R). After the protective film was peeled off, the precursor was imaged in a CDI 2530 (Esko) and subsequently exposed through an attached mask layer, fixed by vacuum, for 9 minutes with an intensity of 28 mW/cm$^2$ in a Combi FIII exposure unit (Flint Group) by means of fluorescent tubes (Philips TL 60 W/10-R). After removal of the mask layer, the precursor was developed in a Nyloflex® Flowline Washer FV (Flint Group) by means of Cyrel® Flexosol-i (DuPont) as washout medium and at a rate of 250 mm/min. Drying took place at 60° C. over 120 minutes. Re-exposure then took place at room temperature, with the UVA exposure (Philips TL 80W/10-R SLV G13, intensity 12 mW/cm$^2$) and UVC exposure (Philips TUV TL-D 95W HO SLV/25, intensity 11 mW/cm$^2$) being started simultaneously and performed in parallel. The UVA exposure time was 10 minutes and the UVC exposure time 5 minutes.

Print Conditions:

A solvent-based ink, Flexistar MV Process Cyan (Flint Group), was printed by means of an F&K Flexpress 6S/8 printing machine (Fischer & Krecke) on an LD-PE film (Delo) pretreated with corona on one side and having a width of 400 mm and thickness of 55 A Lohmann 5.3 foam adhesive tape (Lohmann) was used to fasten the printing plates. The anilox roller used was provided with a screen resolution of 420 lines/cm and a volume of 3.5 cm$^3$/m$^2$. The print speed was 200 m/min.

TABLE 10

| Example | UVC initiator C3 conc. (%) | UVA/ UVC initiator | MSA conc. (%) | Inflow |
|---|---|---|---|---|
| Reference 9a | 0.0 | – | 1 | -- |
| Example 9b | 0.5 | 2.0 | 1 | 0 |
| Example 9c | 1.0 | 1.0 | 1 | + |
| Example 9d | 1.5 | 0.7 | 1 | + |
| Example 9e | 2.0 | 0.5 | 1 | + |

Very significant inflow=--
Significant inflow=-
Moderate inflow=0
Little inflow=+
No inflow=++

In reference 9a, significant inflow of the plate was observed. The inflow was reduced sharply through the addition of the MSA and the photoinitiator C3 (examples 9b to 9e). From a concentration of 1.0% of the UVC photoinitiator C3 (example 9c) hardly any inflow is observed. The same applies for a further increase in the UVC photoinitiator concentration to 1.5% or 2.0% (examples 9d and 9e) (Table 10).

Example 10

An SIS-based relief precursor (overall thickness 1.14 mm) was produced on a polyester carrier with 1% by weight of a paraffin wax (>C20) having a melting point of 50-57° C. as MSA, 2% by weight of benzil-α,α-dimethyl acetal (IGM Resins B.V.) and 0% or 0.5% of a 1-hydroxycyclohexylphenyl ketone (IGM Resins B.V.). The relief precursor was exposed from the back for 10 seconds with an intensity of 16 mW/cm² in a Nyloflex® Combi FIII exposure unit (Flint Group) by means of fluorescent tubes (Philips TL 80W/10-R). After the protective film was peeled off, the precursor was imaged in a ThermoFlexX 20 (Xeikon) and subsequently exposed through the mask layer for 15 minutes with an intensity of 16 mW/cm² at 40° C. in a Nyloflex® Combi FIII exposure unit (Flint Group) by means of fluorescent tubes (Philips TL 80W/10-R). The exposed precursor was washed out in a Nyloflex® Digital Washer FIII (Flint Group) by means of nylosolv A and at a rate of 200 mm/min. Drying took place at 60° C. over 120 minutes. Different re-exposures were then carried out in a Nyloflex® Combi FIII exposure unit, whereby only UVA (Philips TL 60W/10-R, intensity 11 mW/cm²), only UVC (Philips TUV 75W HO G75 T8, intensity 13 mW/cm²) or simultaneous UVA and UVC exposures were used, in each case at 40° C. In this context simultaneous means that both exposures (UVA and UVC) were started at the same time. After at least one week of storage following development of the printing plates, contact angle measurements were carried out on the printing surfaces thus formed. The reference used was a surface of pure MSA which was obtained by melting and subsequent cooling.

The contact angle is a measure of the wetting of the surface. The uniform wetting of the surface with liquid (printing ink) is a fundamental prerequisite for a successful printing process. If wetting is not complete, it will not be possible to transfer the printing forme fully onto the print medium. Wetting is critically determined by the difference between surface tension of the printing ink and the surface energy of the printing plate. A drop of liquid on a surface shows a large contact angle if there is a significant difference between the surface tension of the liquid and the surface energy of the printing plate. If the difference is small, the surface is wet uniformly by the liquid, resulting in a small contact angle. The MSA generates a hydrophobic surface. With polar liquids such as water, for example, a large contact angle is expected.

Table 11 shows the contact angle of a water drop on printing plates with or without MSA on the surface of the plate. The presence of the MSA is controlled by the re-exposure. The pure MSA serves as reference.

TABLE 11

| Example | % UVA PI | % UVC PI | Exposure | UVA dose (mJ/cm²) | UVC dose (mJ/cm²) | UVA/UVC | Contact angle θ/° |
|---|---|---|---|---|---|---|---|
| Reference 10a | — | — | — | — | — | — | 97.9 |
| Example 10b | 2 | 0 | 10A | 6600 | 0 | >100 | 86.7 |
| Example 10c | 2 | 0 | 10A10Cp | 6600 | 7800 | 0.8 | 78.0 |
| Example 10d | 2 | 1 | 5C | 0 | 7800 | 0 | 89.1 |
| Example 10e | 2 | 1 | 10A10Cp | 6600 | 7800 | 0.8 | 64.1 |
| Example 10f | 5 | 0.5 | 5C | 0 | 7800 | 0 | 97.9 |
| Example 10g | 5 | 0.5 | 10A10Cp | 6600 | 7800 | 0.8 | 84.5 |

The presence of the MSA on the surface has an influence on the wetting of the surface with water. If MSA is present on the surface of the printing plate, the contact angle of the water drop is much greater than if no MSA is present on the surface. If MSA is present on the surface of the plate (examples 10b, 10d and 10l), the contact angle of the water drop approaches that of the pure MSA (reference 10a). The photoinitiator concentration has a particular effect on the contact angle if there is no MSA present. With 1% UVC PI (example 10e), a smaller contact angle was obtained than without (example 10c). When printing with water-based ink, the presence of the MSA can consequently lead to wetting problems. The migration of the MSA can be controlled through re-exposure.

Example 11

An SBS-based relief precursor (overall thickness 1.14 mm) was produced on a polyester carrier with 1% by weight of a paraffin wax (>C20) having a melting point of 50-57° C. as MSA and 5% by weight of benzil-α,α-dimethyl acetal (IGM Resins B.V.). The relief precursor was exposed from the back for 18 seconds with an intensity of 16 mW/cm² in a Nyloflex® Combi FIII exposure unit (Flint Group) by means of fluorescent tubes (Philips TL 80W/10-R). After the protective film was peeled off, the precursor was imaged in a ThermoFlexX 20 (Xeikon) and subsequently exposed through the mask layer for 15 minutes with an intensity of 16 mW/cm² at 40° C. in a Nyloflex® Combi FIII exposure unit (Flint Group) by means of fluorescent tubes (Philips TL 80W/10-R). The exposed precursor was washed out in a Nyloflex® Digital Washer FIII (Flint Group) by means of nylosolv A and at a rate of 220 mm/min Drying took place at 60° C. over 120 minutes. The printing plate was subsequently re-exposed to UVA-light (Philips TL 60W/10-R, intensity 11 mW/cm²) for 10 min and to UVC light (Philips TUV 75W HO G75 T8, intensity 13 mW/cm²) for 5 min in a Nyloflex® Combi FIII exposure unit. Both exposures (UVA and UVC) were started at the same time and carried out at 40° C. After at least one week of storage following development of the printing plates, contact angle measurements were carried out on the printing surfaces thus formed. The reference used was a surface of pure MSA which was obtained by melting and subsequent cooling.

TABLE 12

| Example | % MSA | Exposure | UVA dose (mJ/cm²) | UVC dose (mJ/cm²) | UVA/UVC | Contact angle θ/° |
|---|---|---|---|---|---|---|
| Reference 11a | 100 | — | — | — | — | 97.9 |
| Example 11b | 1 | 10A5C | 6600 | 3900 | 1.7 | 94.2 |
| Example 11c | 0 | 10A5C | 6600 | 3900 | 1.7 | 80.5 |

If there is MSA present on the surface of the printing plate (example 11b), the contact angle approaches that on the pure MSA (reference 11a). Without MSA on the surface of the plate (example 11c), a much smaller contact angle is obtained even when the other processing conditions are the same.

Example 12

An SBS-based relief precursor (thickness 1.14 mm) was produced on a polyester carrier with 1% by weight of a paraffin wax (>C35) having a melting point of 58° C. as MSA and 2% by weight of benzil-α,α-dimethyl acetal (IGM Resins B.V.). The plates contained either no MSA or 1% by weight of a paraffin wax (>C35) having a melting point of 58° C., or 0.5% by weight of a polysiloxane polyester acrylate (PPA) as MSA. The relief precursor was exposed from the back for 20 seconds with an intensity of 26 mW/cm² in a Combi FIII exposure unit (Flint Group) by means of fluorescent tubes (Philips TL 60 W/10-R). After the protective film was peeled off, the precursor was imaged in a CDI 2530 (Esko) and subsequently exposed through the mask layer for 10 minutes with an intensity of 26 mW/cm² in a Combi FIII exposure unit (Flint Group) by means of fluorescent tubes (Philips TL 60 W/10-R). The precursor was developed in a Nyloflex® Flowline Washer FV (Flint Group) by means of nylosolv A (Flint Group) and at a rate of 255 mm/min Drying took place at 60° C. over 120 minutes. Re-exposure then took place at room temperature, with the UVA exposure (Philips TL 80W/10-R SLV G13, intensity 12 mW/cm²) and UVC exposure (Philips TUV TL-D 95W HO SLV/25, intensity 11 mW/cm²) being started simultaneously and performed in parallel. The UVA exposure time was 10 minutes and the UVC exposure time 6 minutes.

Print Conditions:

An MO4 printing machine with FA4 flexo units (Nilpeter) was used for printing with the Flexocure Ancora Process Cyan UV-curing ink (Flint Group). The print medium used was PE-based self-adhesive label material (Raflatac) corona treated on one side or paper-based self-adhesive label material (Raflacoat, UPM) of thickness 120 μm. A Tesa Blue foam adhesive tape of moderate hardness (Tesa) was used to secure the printing plates. The anilox roller used was provided with a screen resolution of 500 lines/cm and a volume of 2.5 cm³/m². The print speed was 100 m/min. The inflow was assessed after about 500 linear metres.

Results:

Table 13: Inflow of the plate after printing on PE film and paper. Re-exposure used: intensity UVA 7200 mJ/cm²; UVC=3960 mJ/cm². Ratio of UVA/UVC re-exposure intensities=1.8.

TABLE 13

| Print medium | MSA | Concentration MSA/% by weight | Inflow with UV-curing ink |
| --- | --- | --- | --- |
| PE film | No MSA | 0 | -- |
|  | Paraffin wax | 1 | + |
|  | PPA | 0.5 | ++ |
| Paper | No MSA | 0 | -- |
|  | Paraffin wax | 1 | + |
|  | PPA | 0.5 | ++ |

Table 13 shows the effect of the MSA on the inflow of the plate when printing with UV-curing ink. Without MSA, significant inflow is observed. The inflow of the block can be reduced sharply by adding a paraffin wax as MSA. A further improvement in the inflow is observed when a polysiloxane polyester acrylate is used as MSA.

The invention claimed is:

1. Photopolymerisable relief precursor comprising:
   (A) a dimensionally stable carrier,
   (B) a photopolymerisable relief-forming layer at least containing
      a crosslinkable elastomeric binder,
      an ethylenically unsaturated monomer,
      an additive, said additive being migration-capable, and surface-active, a photoinitiator activatable with UVA light, and
      a photoinitiator activatable with UVC light;
   wherein said additive is present in an amount of 0.1 to 10% by weight based on the weight of the photopolymerisable relief-forming layer;
   wherein the photoinitiator activatable with UVA light is selected from the group consisting of benzil ketals, acylphosphine oxides, bisacylphosphine oxides, aminophenyl ketones, phenyloxime esters and mixtures thereof; and
   wherein the photoinitiator activatable with UVC light is selected from the group consisting of hydroxyphenyl ketones, benzoyl formates, arylalkyl ketones, arylbenzyl ketones and mixtures thereof;
   wherein the additive is a paraffin wax with a chain length of more than 15 C atoms or wherein the additive is a polysiloxane polyester acrylate.

2. Photopolymerisable relief precursor according to claim 1, wherein the photoinitiator activatable with UVC light is selected from the group consisting of oxyphenyl acetic acid 2-[2-oxo-2-phenylacetoxy-ethoxy]ethylester, oxyphenyl acetic acid 2-[2-hydroxyethoxy]ethylester, p-tolyl undecyl ketone, 1-hydroxycyclohexyl phenyl ketone and 2-hydroxy-2-methyl-1-phenyl propane-1-on.

3. Photopolymerisable relief precursor according to claim 1, wherein the photoinitiator activatable with UVA light is selected from the group consisting of diphenyl (2,4,6-trimethyl benzoyl) phosphine oxide, benzil dimethyl ketal and benzil diethyl ketal, and wherein the photoinitiator activatable with UVC light is selected from the group consisting of oxyphenyl acetic acid 2-[2-oxo-2-phenylacetoxy-ethoxy] ethylester, oxyphenyl acetic acid 2-[2-hydroxyethoxy]ethylester, methylbenzoyl formate, p-tolyl undecyl ketone, 1-hydroxycyclohexyl phenyl ketone and 2-hydroxy-2-methyl-1-phenyl propane-1-on and mixtures thereof.

4. Photopolymerisable relief precursor according to claim 1,
   wherein the photopolymerisable relief-forming layer contains the additive in an amount 0.2 to 5% by weight and preferably 0.5 to 1.5% by weight based on the weight of the photopolymerisable relief-forming layer; and/or
   wherein the photopolymerisable relief-forming layer contains the photoinitiator activatable with UVA light in an amount of 0.5 to 20% by weight, preferably 0.5 to 15% by weight, more preferably 0.5 to 10% by weight and very preferably 0.5 to 6% by weight based on the overall weight of the photopolymerisable relief-forming layer.

5. Photopolymerisable relief precursor according to claim 1, wherein the photopolymerisable relief-forming layer contains the photoinitiator activatable with UVC light in a concentration of 0.1 to 20% by weight, preferably 0.1 to 10% by weight, more preferably 0.5 to 5% by weight and very preferably 0.25 to 3% by weight based on the overall weight of the photopolymerisable relief-forming layer; and/or wherein the mass ratio of photoinitiator activatable with UVA light to photoinitiator activatable with UVC light is 0.1 to 50, preferably 0.5 to 40, more preferably 0.5 to 30 and very preferably 0.5 to 15.

6. Method for the production of a relief structure for printing with a printing ink, comprising:
   provision of a photopolymerisable relief precursor containing at least one migration-capable, surface-active additive;
   generating a relief:
      by exposure of the photopolymerisable relief-forming layer to electromagnetic radiation through a mask or mask layer applied or generated above the photopolymerisable relief precursor and removal of the mask or mask layer, any further layers that may be present and the non-photopolymerised regions of the relief-forming layer not exposed, thereby generating the relief; or by imaging exposure of the photopolymerisable relief-forming layer to electromagnetic radiation and removal of any further layers that may be present and non-photopolymerised areas of the relief-forming layer not exposed by the imaging exposure, thus generating the relief;

re-exposure of the generated relief from the side facing away from the carrier layer to UVA light in the wavelength range from 315 to 380 nm, or to UVA light in the wavelength range from 315 to 380 nm and to UVC light in the wavelength range from 200 to 280 nm, whereby the relief is re-crosslinked and its permeability for the migration-capable surface-active additive is adjusted, for adjustment of the surface properties of the relief, wherein the re-exposure conditions are adjusted as a function of the type of printing ink such that the surface properties of the relief are adjusted to favour wetting of said type of printing ink.

7. Method according to claim 6, wherein the re-exposure is to the UVA light and the UVC light, whereby the re-exposure to the UVA light and the UVC light takes place simultaneously, consecutively or alternately.

8. Method according to claim 6, wherein through the choice and adjustment of re-exposure conditions, the surface properties are adjusted in such a way that the printing plate is suitable for printing with solvent-based inks, aqueous inks or UV-curing inks.

9. Method according to claim 6, wherein the method is performed multiple times, whereby the re-exposure to the UVA light and/or the UVC light is varied in respect of the dose and/or of the chronological sequence of the UVA and UVC re-exposure steps to adjust the surface properties of the relief.

10. Method according to claim 6, wherein the migration of the at least one migration-capable, surface-active additive is controlled by selection of the exposure parameters of the re-exposure step.

11. Method according to claim 6, wherein there is re-exposure to UVA light with a dose from 100 to 30,000 mJ/cm2, preferably 100 to 20,000 mJ/cm2, more preferably 100 to 7,000 mJ/cm2 and very preferably 500 to 7,000 mJ/cm2 UVA light; and/or wherein there is re-exposure to UVC light with a dose from 100 to 20,000 mJ/cm2, preferably 100 to 20,000 mJ/cm2, more preferably 100 to 8,000 mJ/cm2 and very preferably 500 to 8,000 mJ/cm2 UVC light.

12. Method according to claim 6, wherein the ratio of doses of UVA to UVC light (DUVA/DUVC) is greater than 0.2.

13. Method according to claim 12, wherein the ratio of doses of UVA to UVC light (DUVA/DUVC) is greater than 0.6 and very preferably greater than 0.8.

14. Method according to claim 6, wherein the exposure to the UVC light in the wavelength range from 200 to 280 nm seals the surface of the layer due to the lower depth of penetration and the exposure to the UVA light in the wavelength range from 315 to 380 nm ensures stronger cross-linking throughout the layer.

15. Relief structure obtainable using the method according to claim 6.

16. Method according to claim 6, wherein the printing ink is a hydrophilic printing ink and wherein the exposure conditions of the re-exposure step are adjusted to the UVC light or to the UVC and the UVA light to favour wetting of the surface of the relief with said hydrophilic printing ink.

17. Method according to claim 6, wherein the exposure conditions of the re-exposure step are adjusted to UVA light only to favour wetting of the surface of the relief with a hydrophobic ink.

18. Method according to claim 6, wherein the non-photopolymerised regions of the relief-forming layer are removed by treatment with a washout medium or by thermal treatment.

19. Method according to claim 6, wherein the type of printing ink is a solvent ink and wherein the wherein the ratio of doses of UVA to UVC light (DUVA/DUVC) is greater than greater than 0.4.

20. Method according to claim 6, wherein the printing ink is a solvent ink and wherein the wherein the ratio of doses of UVA to UVC light (DUVA/DUVC) is greater than greater than 0.6.

21. Method according to claim 6, wherein the printing ink is a UV-curing ink and wherein the wherein the ratio of doses of UVA to UVC light (DUVA/DUVC) is greater than greater than 0.4.

22. Method according to claim 6, wherein the printing ink is a UV-curing ink and wherein the wherein the ratio of doses of UVA to UVC light (DUVA/DUVC) is greater than greater than 0.6.

23. Method according to claim 6, wherein the printing ink is a hydrophilic ink.

24. Method according to claim 23, wherein the re-exposure is performed with UVA light in the wavelength range from 315 to 380 nm and with UVC light in the wavelength range from 200 to 280 nm.

25. Method according to claim 6, wherein the re-exposure is to the UVA light and the UVC light, whereby the re-exposure to the UVA light and the UVC light takes place simultaneously or alternately.

* * * * *